(12) United States Patent
Iyer et al.

(10) Patent No.: US 12,332,293 B2
(45) Date of Patent: Jun. 17, 2025

(54) SYSTEMS AND METHODS FOR POWER LINE FAULT DETECTION

(71) Applicant: SENTIENT TECHNOLOGY HOLDINGS, LLC, Wichita, KS (US)

(72) Inventors: Giridhar Iyer, Burlingame, CA (US); Mirrasoul J. Mousavi, San Jose, CA (US); Travis Barton, Wichita, KS (US); Jong Min Lim, Mountain View, CA (US); Jenya Okuneva, Wichita, KS (US)

(73) Assignee: SENTIENT TECHNOLOGY HOLDINGS, LLC, Frisco, TX (US)

( * ) Notice: Subject to any disclaimer, the term of this patent is extended or adjusted under 35 U.S.C. 154(b) by 435 days.

(21) Appl. No.: 17/780,009

(22) PCT Filed: Nov. 25, 2020

(86) PCT No.: PCT/US2020/062213
§ 371 (c)(1),
(2) Date: May 25, 2022

(87) PCT Pub. No.: WO2021/108537
PCT Pub. Date: Jun. 3, 2021

(65) Prior Publication Data
US 2023/0012038 A1 Jan. 12, 2023

Related U.S. Application Data

(60) Provisional application No. 62/941,425, filed on Nov. 27, 2019.

(51) Int. Cl.
*G06F 11/30* (2006.01)
*G01R 19/02* (2006.01)
(Continued)

(52) U.S. Cl.
CPC .......... *G01R 31/086* (2013.01); *G01R 19/02* (2013.01); *H02H 1/0092* (2013.01); *H02H 3/04* (2013.01);
(Continued)

(58) Field of Classification Search
CPC .................................................. G01R 31/086
See application file for complete search history.

(56) References Cited

U.S. PATENT DOCUMENTS

| 5,181,026 A | 1/1993 | Granville |
| 2013/0054162 A1* | 2/2013 | Smith ............... H02J 13/00002 702/58 |
| 2017/0045571 A1 | 2/2017 | Joseph et al. |

OTHER PUBLICATIONS

International Preliminary Report on Patentability received for PCT Application No. PCT/US2020/062213, mailed on Jun. 9, 2022, 09 Pages.
(Continued)

*Primary Examiner* — Phuong Huynh
(74) *Attorney, Agent, or Firm* — Perilla Knox & Hildebrandt LLP; Thomas B. Hildebrandt

(57) ABSTRACT

A power distribution monitoring system (100) is provided that can include a number of features. The system can include a plurality of monitoring devices configured to attach to conductor(s) on a power grid distribution network. In some embodiments, a monitoring device is disposed on each conductor of a three-phase network and utilizes a complex platform of software and hardware to detect faults and disturbances that can be analyzed to determine or predict the risk of wildfires.

20 Claims, 14 Drawing Sheets

(51) Int. Cl.
*G01R 31/08* (2020.01)
*H02H 1/00* (2006.01)
*H02H 3/04* (2006.01)
*H02H 3/12* (2006.01)
*H04Q 9/00* (2006.01)

(52) U.S. Cl.
CPC ................ *H02H 3/12* (2013.01); *H04Q 9/00* (2013.01); *H04Q 2209/823* (2013.01)

(56) References Cited

OTHER PUBLICATIONS

International Search Report and Written Opinion received for PCT/US2020/062213, mailed on Mar. 2, 2021, 10 Pages.

\* cited by examiner

| No | Grid Ignition Sources | Electrical Disturbance KPI | Mechanical Disturbance KPI | GISD Metric count |
|----|----|----|----|----|
| 1 | Vegetation | Yes/No | Yes/No | #/feeder/hour |
| 2 | Conductor | Yes/No | Yes/No | #/feeder/hour |
| 3 | Grid Equipment | Yes/No | Yes/No | #/feeder/hour |
| 4 | Winds | Yes/No | Yes/No | #/feeder/hour |
| 5 | Animal | Yes/No | Yes/No | #/feeder/day |

SYSTEMS AND METHODS FOR POWER LINE FAULT DETECTION

RELATED APPLICATION

This Application claims priority to U.S. Patent Application Ser. No. 62/941,425, filed Nov. 27, 2019, which is incorporated herein in its entirety by reference.

FIELD

The present application relates generally to distribution line monitoring and associated sensors that detect power line faults. Certain embodiments herein may be utilized for mitigating the risk of wildfire.

BACKGROUND

Intelligent line sensors and devices are increasingly used in distribution and transmission systems to enhance system monitoring and situational awareness. These devices feature different capabilities and together with operational technologies in the control room offer unprecedented opportunities for grid modernization and management of DERs (Distributed Energy Resources). Sensors with a floating voltage reference point offer cost-effective ways to capture field measurements such as e-field, line current, and conductor temperature. These sensors are equipped with on-board computer, storage, and communications making them an ideal fit for utility IoT (Internet of Things) applications at the edge of the grid. One such area of interest is wildfire prevention and detection.

Many governments depend on different entities (Investor-Owned-Utilities (IOUs), public municipalities/cooperatives, independent power producers, consumer choice aggregators, etc.) to share the cause of building, maintaining and operating a statewide electric grid infrastructure. The central goal of this infrastructure is to provide affordable, clean electricity to all residents, properties and public/private organizations in a predictable, reliable, safe way. These entities face the increasing threat of wildfires, including wildfires caused by faulty, damaged, or undermaintained electrical grids.

Electrical utilities (private, public, or co-ops/municipalities) are typically compensated by regulators (e.g., the CPUC in Calif.) for improving reliability through the reduction of outage frequencies and duration. Thus, there is a need for fault detection and location identification, including wildfire detection and location, that reduces outage times by enabling fault location and reducing the System Average Interruption Duration Index (SAIDI) metric. Improving Reliability also includes reducing the System Average Interruption Frequency Index (SAIFI) metric.

SUMMARY OF THE DISCLOSURE

This disclosure generally provides distribution line monitoring sensors that include a number of features. Particularly, described herein are distribution line monitoring sensors with energy harvesting devices that are configured to maximize harvested power from power distribution lines. Additionally, described herein are distribution line monitoring sensors with energy harvesting devices that provide a constant current output characteristic to allow maximum utilization of power by connecting multiple devices in series or in parallel.

No single approach can eliminate the wildfire risk or address all the wildfire ignition risk factors. However, provided herein is a holistic situational awareness and analytics solution portfolio of sensors, cameras, weather stations, aerial surveys using drones/planes, analytical software needs to be implemented to get a chance to predict, detect and get ahead of these dangerous wildfires. This solution also requires close coordination between Emergency Response Agencies, Firefighter agencies, other federal/state agencies, public and private utilities, etc. to give the monitoring entity a chance to move from reactive mitigation to proactive management and finally to predictive actions that reduce wildfire risks. Advantageously, embodiments described herein provide a unique online and real-time view of distribution power lines that is more complete, granular, and actionable than using data from "eyes from the sky," "nearest camera", or "nearest weather station."

In certain embodiments, a power line sensor with power line fault analytics, includes: a wireless interface, an e-field sensor, a current sensor, a processor communicatively coupled with the wireless interface, the e-field sensor, and the current sensor, and memory communicatively coupled with the processor. The memory stores: at least one fault signature having an e-field template defining e-field attributes that occur in response to a line break, and a current template defining current attributes that occur in response to the line break; and machine-readable instructions that, when executed by the processor, cause the processor to: determine e-field key parameters based on e-field data, representing electrical field produced by a power line to which the line sensor is installed, received from the e-field sensor; determine current key parameters based on current data, representing current through the power line, received from the current sensor; cross-correlate the e-field key parameters and the current key parameters to determine a line break; and send, via the wireless interface, an alert to a server indicating the line break.

In certain embodiments, a computer-implemented method for line-fault detection, includes: receiving e-field data from an e-field sensor of a line sensor positioned at a power line; calculating e-field RMS values for the e-field data; receiving current data from a current sensor of the line sensor; calculating current RMS values for the current data; determining that characteristics of the e-field RMS values and the current RMS values indicate a line break; and outputting an alert indicating the line break.

In certain embodiments, a system for identifying line-fault on a power line, includes a server, wirelessly connected to a line sensor attached to the power line. The server includes computer readable instructions that, when executed by a processor of the server, cause the server to: receive, from the line sensor, a line break signal, the line break signal being based on captured e-field data and current data, captured by the line sensor, as compared to at least one fault signature template; and output an alert indicating a line break.

BRIEF DESCRIPTION OF THE DRAWINGS

The foregoing and other features and advantages of the disclosure will be apparent from the more particular description of the embodiments, as illustrated in the accompanying drawings, in which like reference characters refer to the same parts throughout the different figures. The drawings are not necessarily to scale, emphasis instead being placed upon illustrating the principles of the disclosure.

DETAILED DESCRIPTION

The systems and methods described herein acknowledge that identifying power-line operation waveforms in the field helps the utility track the health status and the performance of the power lines at the field point of view, on-line and continuously with high fidelity measurements, with high sampling rates or granular temporal resolution simultaneously. Power line monitoring devices and systems described herein are configured to measure the currents and voltages of power grid distribution networks, and to detect a conductor break event that has not tripped protection equipment. One aspect of the embodiments described herein includes the realization that a conductor break that does not activate protection devices may cause wildfires. The present embodiments solve this problem by detecting when characteristics in sensed electric field and sensed current match previously captured characteristics that resulted in a downed conductor without activating protection devices. Advantageously, by detecting such characteristics in sensed electric field and sensed current, the system is able to initiate power cut to the downed conductor to mitigate the risk of a wildfire.

Figure 1:
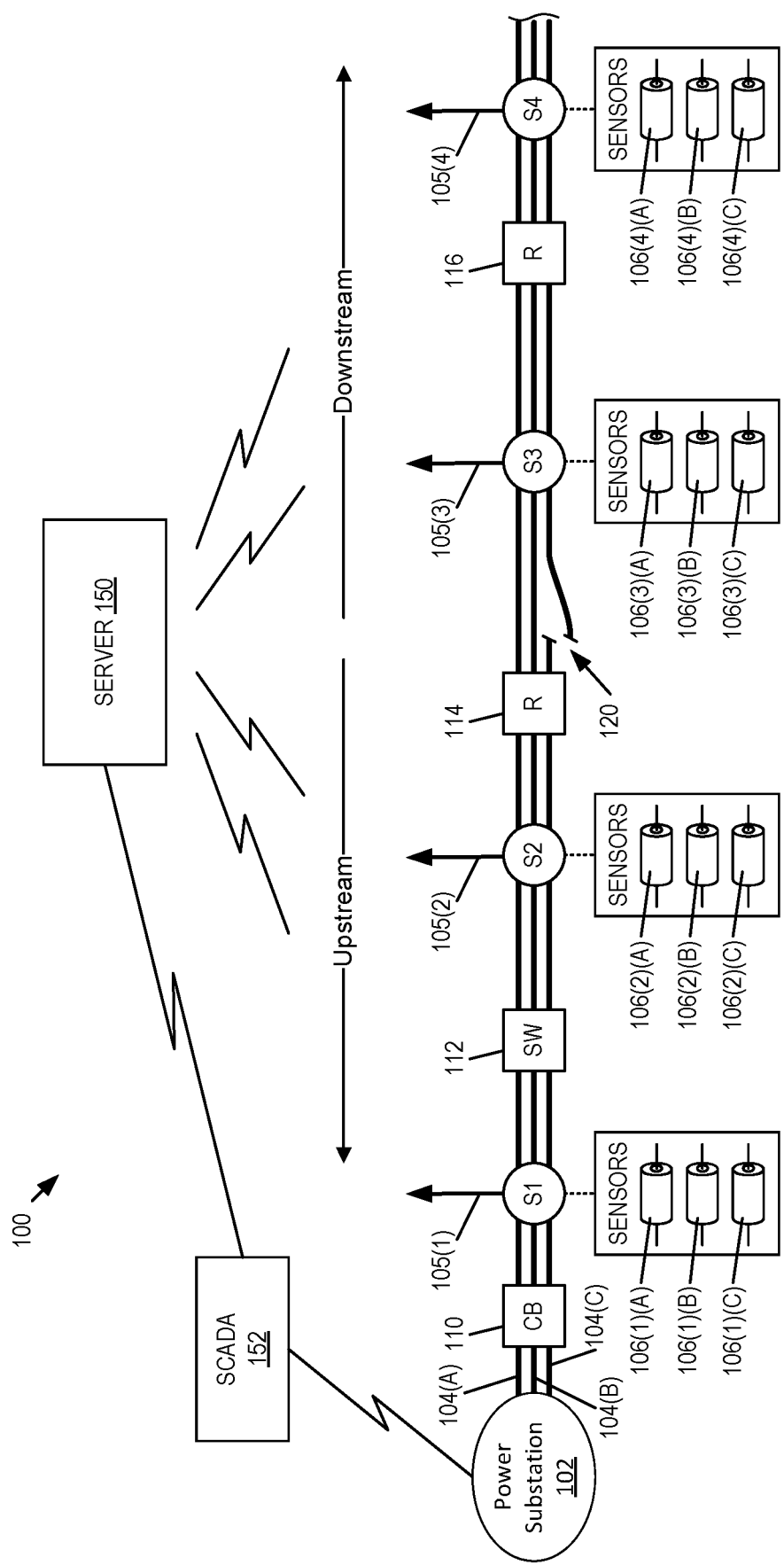
FIG. 1 is a schematic diagram illustrating one example system for power line fault detection, in embodiments.

FIG. 1 is a schematic diagram illustrating one example system 100 for power line fault detection to mitigate risk of wildfire. A power substation 102 represents one of a transmission or a distribution station that distributes the power along a feeder that includes three power lines 104(A), 104(B), and 104(C), each transmitting one of three phases (hereinafter referred to phases A, B and C). A line sensor 106 is placed on each phase of the power lines 104 at certain sensor locations (e.g., shown as sensor locations S1-S4). Accordingly, each sensor location S1-S4 may have one or more line sensors 106, one for each phase A, B and C if present. In the example of FIG. 1, a first set of line sensors 106(1)(A), 106(1)(B), and 106(1)(C) are positioned to sense power lines 104(A), 104(B) and 104(C), respectively, at sensor location S1, which is between a circuit breaker 110 and a switch 112; a second set of line sensors 106(2)(A), 106(2)(B), and 106(2)(C) are positioned to sense power lines 104(A), 104(B) and 104(C), respectively, at sensor location S2, which is between switch 112 and a first recloser 114; a third set of line sensors 106(3)(A), 106(3)(B), and 106(3)(C) are positioned to sense power lines 104(A), 104(B) and 104(C), respectively, at sensor location S3, which is between first recloser 114 and second recloser 116; and a fourth set of line sensors 106(4)(A), 106(4)(B), and 106(4)(C) are positioned to sense power lines 104(A), 104(B) and 104(C), respectively, at sensor location S4, which is after second recloser 116. System 100 may include other components without departing from the scope hereof. For example, additional sets of sensors 106 may be positioned at strategic locations along power line 104 on single phase or multi-phase laterals to detect anomalies and events at the power line. Although FIG. 1 shows multiple sensors 106 positioned on each power line 104(A), 104(B), and 104(C) of a three-phase power distribution grid (e.g., at voltages close to 15 kV class), system 100 may also operate on a single power line of a single-phase distribution grid operating at lower voltages without departing from the scope hereof.

In the example of FIG. 1, a line break 120 occurs in power line 104(C) between first recloser 114 and second recloser 116, resulting in a portion of power line 104(C) falling towards the ground. However, in this example, line break 120 may not activate protection equipment (e.g., any of circuit breaker 110, switch 112, first recloser 114, and second recloser 116) and thus line break 120 does not cause de-energization of power line 104(C). Accordingly, there is a risk of the downed power line starting a wildfire, particularly when the conductor causes an arc near dry vegetation for example.

Each line sensor 106 includes an electric field sensor, a current sensor and a positioning interface that provides an accurate time stamp and location to the data as it is collected. A non-limiting example of line sensor 106 is the MM3 intelligent grid sensor manufactured by Sentient Energy. Each line sensor 106 includes a wireless interface 105 for communicating with a server 150 that is remotely located from sensors 106 (e.g., a server located in the cloud), such that data may be telemetered to server 150 for further evaluation, processing, and storage. Server 150 may represent any external processing that is wirelessly connected to line sensors 106 for processing and evaluating data. The line sensor 106 may send data to server 150 in real-time, where the data includes one or more of sensed electric field and sensed current of the power line 104, and Global Navigation Satellite System (GNSS) (e.g., GPS) location and a time stamp. In certain embodiments, the line sensors 106 may send a reduced data set that is preprocessed to identify characteristics or markers that are sent to the server 150, thereby reducing the amount of data being transmitted. The server 150 communicates with the line sensors 106 via a wireless interface. The server 150 may evaluate electric field, current, and GNSS data to determine a status of the power line 104 and may store the data in memory. The GNSS time stamp included in the telemetry may be used to synchronize data received from multiple line sensors 106, allowing the server 150 to determine which sensors are upstream and downstream of any identified characteristics or markers. Knowing the GNSS location for each sensor determines where in the grid array of sensors each sensor is located and how far it is from any detected characteristics or marker. In certain embodiments, the data may be used to develop one or more learning algorithms for processing data from sensors that are further removed from the detected characteristics and markers. For example, server 150 may detect transients at multiple sets of sensors corresponding to the same fault. Advantageously, the machine learning algorithms may be used to evaluate characteristics sensed across the grid.

In certain embodiments, line sensors 106 evaluate the sensed electric field data and the current data in real-time to detect conductor breaks where protection devices are not actuated. Other functions of the server 150 may also be performed by the line sensors 106 themselves. By transmitting their data to the other sensors, they can each evaluate the sets of waveforms and determine a status of the power line 104. Thus, the function of the server 150 may be performed in a distributed processing manner among a set of line sensors 106 and their associated processors.

The status of the power line 104 may be transmitted to a SCADA 152 (or other power grid controller), for analysis and operational control based thereon. Information from the SCADA 152 may further be utilized to verify operation of the system 100, such as by comparing determined status of the power line 104 to generate control signals for the protection devices 110, 112, 114, and 116 from the SCADA 152.

Figure 2:
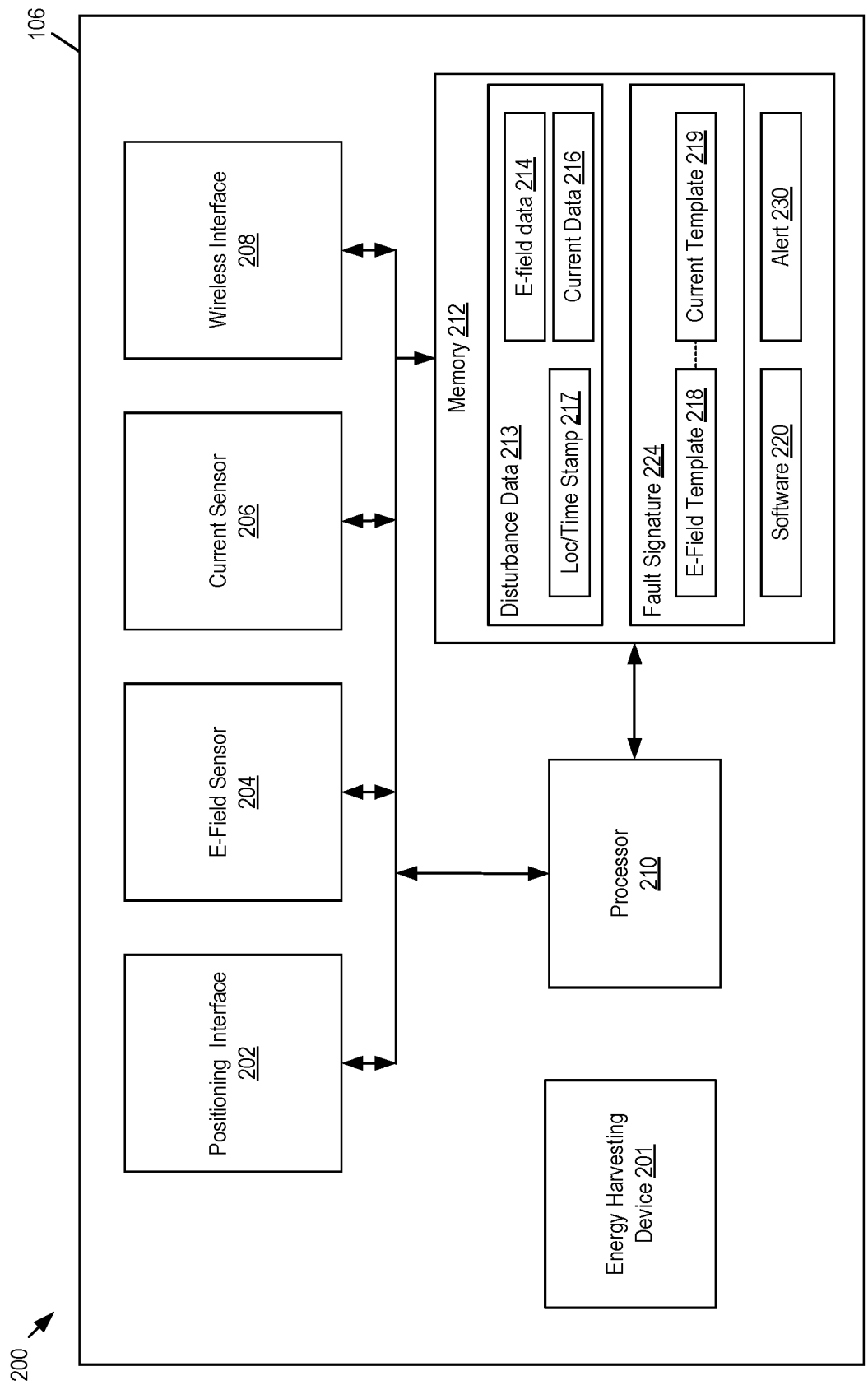
FIG. 2 is a block diagram showing the line sensor of FIG. 1 in further example detail, in embodiments.

FIG. 2 is a block diagram 200 showing the line sensor 106 of FIG. 1 in further example detail. Line sensor 106 includes a positioning interface 202, an electric field (or E-field) sensor 204, a current sensor 206, a wireless interface 208, a processor 210, and memory 212. As discussed above, each sensor 106 is configured to mechanically attach to one phase (e.g., A, B, or C) of power line 104, and, as shown in FIG. 1, three line sensors 106 may be used at each sensor location (e.g., sensor locations S1, S2, S3, and S4). Thus, each line sensor 106 of FIG. 1 may be an individual instance of the line sensor 106 depicted by block diagram 200. In certain embodiments, each set of three lines sensors at one sensor location (e.g., one of sensor locations S1-S4) may share components of the block diagram 200. For example, for a set of three line sensors 106(3)(A), 106(3)(B), and 106(3)(C) at sensor location S3, there may be a single instance of one or more of positioning interface 202, wireless interface 208, processor 210, and memory 212 that couple to a set of three e-field sensors 204, and a set of three current sensors 206 that are each physically located on a respective phase (A, B and C) of power line 104.

The positioning interface 202 includes location-gathering circuitry, such as, but not limited to: GPS, GLONAS, BeiDou, QZSS, IRNSS, NavIC, cellular-triangulation, etc. The positioning interface 202 captures accurate location and time stamps, which are stored in the memory 212 in association with sensed e-field data 214 and sensed current data 216.

The E-field sensor 204 measures the electric field strength in close proximity to the power line 104. The E-field is produced by the presence of voltage on a charged conductor of the power line 104, regardless of the current. The value measured can be affected by all voltage sources around the conductor.

The current sensor 206 measures current through the line 104. The current sensor 206 may include a current transformer to measure the current on line 104. The measurements by the current sensor 206 may be paired with measurements by the e-field sensor 204 to determine a power factor for the power line 104. The power factor is determined by the angle between the voltage and current. At a unity power factor, or a power factor of one, the voltage and current are in phase with each other. Unity power factor gives the maximum power transfer. With an overall inductive load, the voltage lags the current reducing the power factor. A capacitor bank may be connected to the power line 104 to offset the inductive characteristics caused by loads occurring throughout the power grid. The line sensor 106 may implement a sampling rate of about 7800 samples-per-second (e.g., 128-130 samples per cycle at 60 Hz) for each of the e-field sensor 204 and the current sensor 206.

As discussed above, the position interface 202 enables time and location stamping such that the e-field and current data captured by e-field sensor 204 and current sensor 206, respectively, can be stored in memory along with a location and time stamp. In particular, the position interface 202 provides accuracy up to a few microseconds. Thus e-field and current data can be time stamped and placed at a particular sensor so that their information may be correlated. The data in the memory 212 may then be communicated with a server 150 a wireless interface 208.

The processor 210 may be any computing device capable of executing non-transitory computer readable instructions. The memory 212 may be any data storage device capable of storing the e-field data 214 and current data 216 from the e-field sensor 204 and current sensor 206, respectively. The memory 212 may further store software 220 with machine-readable instructions that, when executed by the processor 210, implement the functionality of the line sensor 106 discussed herein.

In the example of FIG. 2, when a disturbance in the e-field and/or current are detected, software 220 may create disturbance data 213 that includes corresponding e-field data 214, current data 216, and a location/time stamp 217 from the position interface 202. The software 220 may send the disturbance data 213 to the server 150 for further processing.

The wireless interface 208 may include hardware and software capable of implementing a wireless protocol including, but not limited to, Wi-Fi, cellular connections (e.g., GSM, GPRS, EDGE, UMTS, HSPA, CDMA, SMS, 3G, 4G, 5G, NB-IoT, LPWAN, etc.). In certain cases, the wireless interface 208 may include a wired interface as opposed to a wireless protocol.

The software 220 may cause the processor 210 to evaluate e-field data 214 and the current data 216 against one or more templates 218/219 to classify the disturbance data 213, such as to detect a fault in the power line 104. An e-field template 218 is paired with a current template 219 and define characteristics of one fault signature. Software 220 may include a linear cross correlation algorithm that processes the sensed e-field data 214 against each e-field template 218 and the sensed current data 216 against each current template 219 to determine whether the e-field data 214 and the current data 216 exhibit characteristics similar to the fault defined by the pair of templates 218/219. Where correlation of both e-field data 214 and current data 216 to the template pair 218/219 are high, software 220 determine that a fault has occurred, generates an alert 230 defining the location and time of the alert 230, and sends the alert 230 to server 150 via wireless interface 208 for example.

The line sensors 106 may include an energy harvesting device 201 that generates and/or harvests power from the power line 104 to provide power for the operation of the line sensor 106. The energy harvesting devices 201 are configured to convert the changing magnetic field surrounding the power line 104 into alternating current (AC) electricity that is rectified into direct current (DC) which is used to power the line sensor 106. In certain embodiments, where multiple energy harvesting device 201 are external to line sensor 106, each being attached to a different phase power line 104(A), 104(B), and 104(C) to harvest and produce a DC output that are summed in parallel to provide a single DC current input to the line sensor 106 for operation. In other embodiments, multiple energy harvesting devices 201 are positioned on a single-phase power line 104.

The line sensor 106 may record and analyze disturbance data 213 as e-field data 214 and current data 216 sensed from the power line 104 and may classify events detected in these waveforms. Software 220 may cause processor 210 to monitor and catalogue e-field and current waveform disturbances, sending at least part of the e-field data 214 and at least part of the current data 216 corresponding to the disturbance data 213 to server 150.

Figure 3:
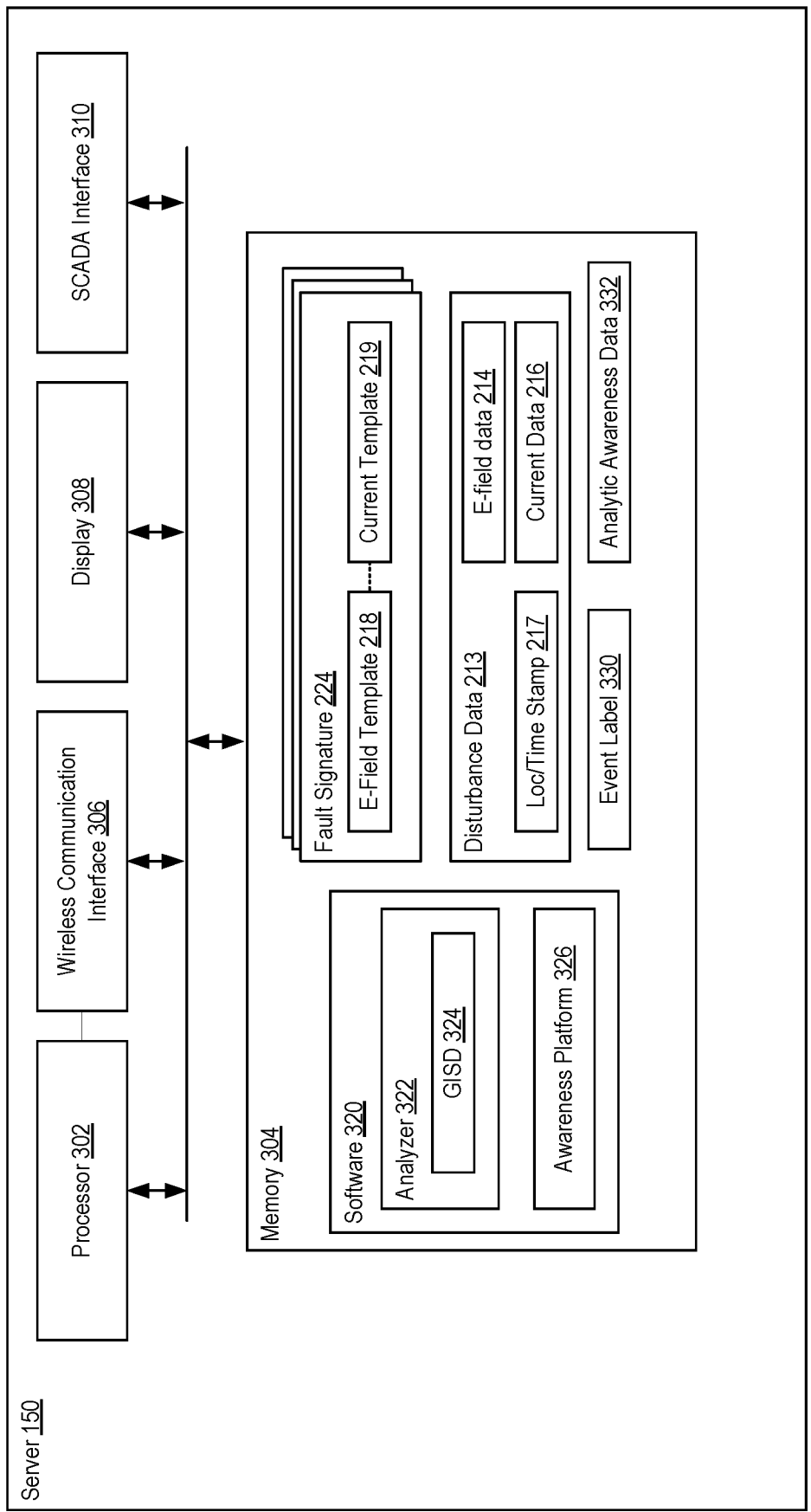
FIG. 3 is a block diagram illustrating the server of FIG. 1 in further example detail, in embodiments.

FIG. 3 is a block diagram 300 illustrating the server 150 of FIG. 1 in further example detail, in embodiments. FIGS. 1, 2 and 3 are best viewed together with the following description. The server 150 may represent one or more computing devices. The server 150 may be a dedicated computing device, such as a local computing device that is owned and stored locally at an on-site location of the grid. Alternatively, the server 150 may represent "cloud" computing where data is transmitted thereto for processing by one or more cloud-computing services, such as Microsoft Azure, Amazon AWS, Google Cloud, etc. Server 150 includes at least one processor 302 (e.g., an intelligent controller) connected to memory 304, a wireless communication interface 306, a display 308 that may be used by an operator, and a SCADA interface 310. In certain embodiments, the SCADA interface 310 may be a component of the wireless communication interface 306, in which data from the server 150 is transmitted to SCADA 152 off-site from the server 150. The display 308 may be external to the server 150, where the data from server 150 is transmitted to an external device (e.g., the SCADA 152 and/or an operational device associated with power substation 102, and/or a remote device such as a phone, tablet, or computer used by a power-system operator) and used to display a status of the power line 104. In certain embodiments, aspects of the server, such as the analyzer 322 discussed below, may be implemented on the line-sensors 106 themselves, either in a single one of the line sensors, or in a plurality of the line sensors in a distributed processing configuration as discussed above.

Server 150 receives the e-field data 214 and the current data 216 from each of the line sensors 106 via the wireless communication interface 306. For example, server 150 may receive disturbance data 213 from line sensor 106 that include e-field data 214, current data 216, and location/time stamp 217 indicative of where and when the disturbance data 213 was detected. The wireless communication interface 306 may include hardware and software capable of implementing a wireless protocol including, but not limited to, Wi-Fi, cellular connections (e.g., GSM, GPRS, EDGE, UMTS, HSPA, CDMA, SMS, 3G, 4G, 5G, NB-IoT, LPWAN, etc.). In certain embodiments, the wireless interface 208 may include a wired interface as opposed to a wireless protocol. The e-field data 214 and the current data 216 received from the sensors 106 through the wireless communication interface 306 may be raw data captured by the e-field sensor 204, and current sensor 206, respectively, or may be a preprocessed string of data consisting of metadata. The received data may or may not be presented on the display 308 and/or SCADA interface 310.

The received disturbance data 213 may be stored in the memory 304. The memory 304 may store software 320 that includes machine-readable instructions that, when executed by the processor 302, implement the functionality of the server 150 as described herein. The software 320 may include an analyzer 322 that implements one or more algorithms for processing the disturbance data 213 received from the line sensors 106. For example, the processor 302, upon execution of the software 320, may reduce or process the e-field data 214 and current data 216 to generate an event label 330 that identifies and classifies key characteristics of the signal waveforms defined thereby. Using these key characteristics, the processor 302 may identify that an event has occurred and, if the data allows, classify the event, and generate the event label 330. In certain embodiments, the line sensor 106 may implement at least part of the analyzer 322 such that the analysis and classification may be performed by the line sensor 106, either individually or collectively as a distributed processing solution between multiple line sensors 106.

Power substation 102, power lines 104, circuit breaker 110, switch 112, and reclosers 114 and 116 may be any type of power network, such as a 60 Hz North American network, or alternatively, a 50 Hz network such as is found in Europe and Asia, for example. The line sensor 106 may be used on high voltage transmission lines that operate at voltages higher than 65 kV.

In some embodiments, software 320 may include an analyzer 322 that provides waveform and event signature cataloguing and profiling for access by the line sensors 106 and by utility companies. For example, software 320 may generate fault signature 224 with the e-field template 218 and the current template 219 that define identifiable characteristics of a type of fault. For example, software 320 may generate fault signature 224 from previously captured e-field data 214 and current data 216. Accordingly, by distributing the fault signature 224 to the plurality of line sensors 106, the system 100 enables fault localization. Advantageously, server 150 may provide information of detected disturbances and faults with remedial action recommendations to utility companies, and generate pre-emptive equipment failure alerts to assists in reliability management of the distribution grid.

The line sensors 106 and methods disclosed herein include multiple software modules that help utilities manage reliability. The system 100 may implement an analysis platform (e.g., Sentient's Ample software platform) that may be distributed across the line sensors 106 and the server 150, which cooperate to monitor normal grid activity and to detect and track abnormal activity such as phase-to-phase faults and/or phase to ground faults in real-time. Faults are often defined as typically large current events that create outages of more than sixty second duration. Momentary outages are caused by faults that last between one and sixty seconds and therefore do not rise to the level of reporting obligation where a utility needs to report these faults to regulators. Accordingly, many utilities have not historically tracked these momentary outage events and associated metrics, even though the capability to do so exists today. Certain aspects of the present embodiments include the realization that closely managing these momentary outages is key to improved safety and becoming proactive with respect to wildfire management. Advantageously, the present embodiments solve this problem by providing line sensors 106 that continuously monitor conditions of power lines 104, detecting faults and disturbances in real-time, and providing alerts and reports that improve safety and enhance response times.

The system 100 forms a network of line sensors 106 positioned on power lines 104 and provides analytic software modules that detect and show a range of disturbance/fault activity on the power grid. This detected activity includes sustained faults (e.g., outages greater than a set duration such as sixty-seconds) that either self-clear due to grid automation equipment like reclosers 114/116 or are cleared by a utility crew. The utility crew may also address pre-failure issues like repetitive momentary faults (e.g., outages lasting between one and sixty-seconds) at the same location that are indicative of vegetation incursion or immanent failure of grid equipment (e.g., failure of conductor insulation and/or coupling, and/or vegetation incursion). The line sensors 106 may also be configured to identify electrical disturbances in the power line 104 (e.g., disturbances/events that last less than one-second, such as a few cycles).

Figure 4:
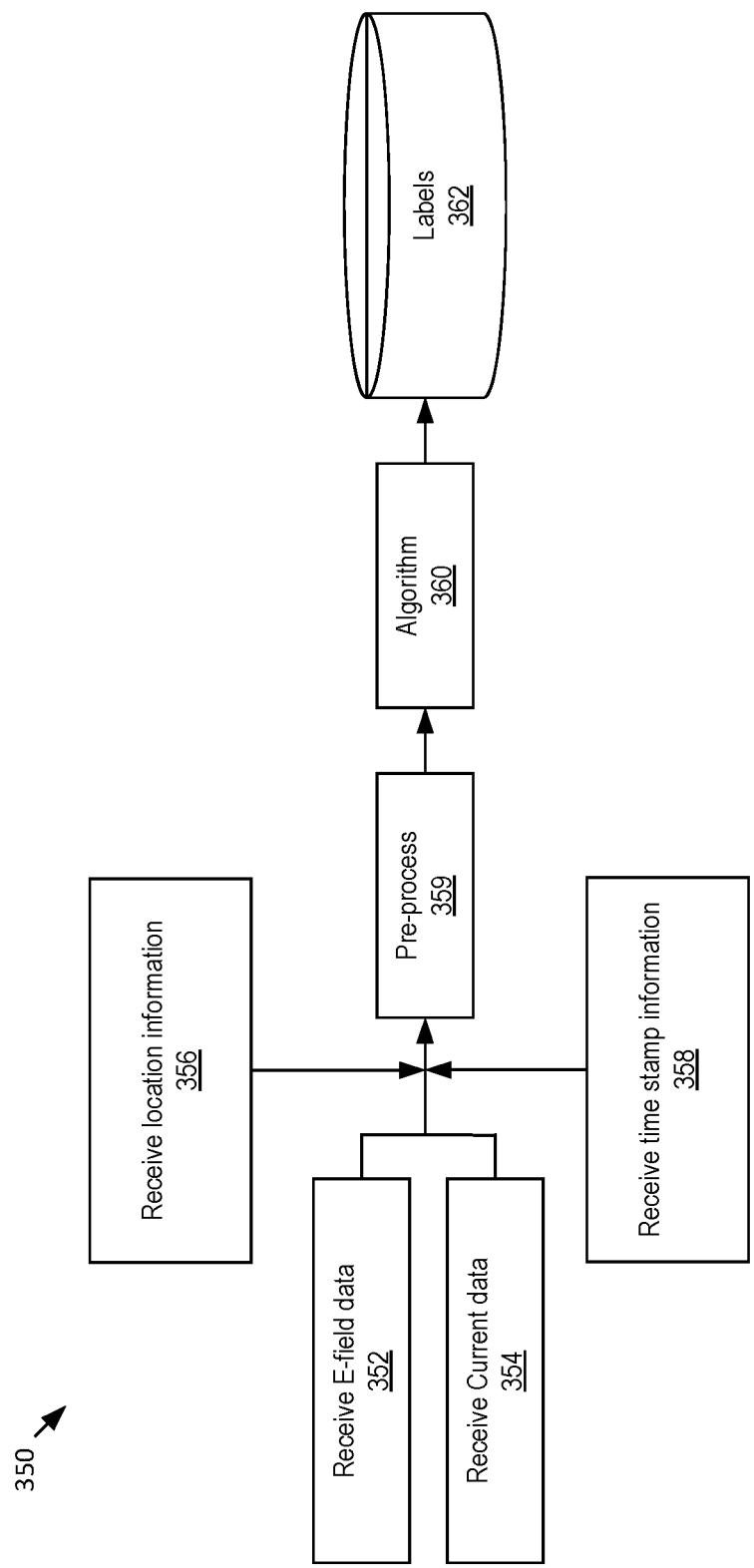
FIG. 4 shows one example process that the server of FIG. 1 uses to receive and process electrical disturbances detected on the power line by line sensors, in embodiments.

FIG. 4 shows one example process 350 that the server 150 of FIG. 1 uses to receive and process electrical disturbances detected on the power line 104 by line sensors 106. Process 350 is implemented, for example, via execution of the software 320 by the processor 302. Certain of the functions of the software 320 may also be performed by the sensors 106 themselves. For example, by transmitting their data to the other sensors 106, one or more of the sensors 106 may include the functionality of the analyzer 322, evaluate the sets of e-field data 214 and current data 216, and generate an event label 330 that may define a status of, or an action for, the power network. Thus, the function of the analyzer 322 may be performed in a distributed processing manner among a set of line sensors 106 and their associated processors 210.

In blocks 352 and 354 of process 350, e-field data is received, and current data is received, respectively. In one example of block 352, the e-field data 214 and the current data 216 captured by the line sensors 106 are received at the server 150.

In blocks 356 and 358 of process 350, location information and time stamps corresponding to the e-field and current data of blocks 352 and 354 are received. In one example of operation of blocks 356 and 358, the location and time information from positioning interface 202 of the line sensor 106 sending the e-field data 214 and the current data 216 is received and stored in location/time stamp 217. It should be appreciated that each of blocks 352, 354, 356, and 358 may be performed simultaneously, where each line sensor 106 transmits a string of data to the server 150 (or other of the line sensors 106) including the e-field data, current data, location information, and the time stamp information.

In block 359, one or more of the e-field data 214, the current data 216, and the location/time stamp 217 may be pre-processed. For example, the data may be partitioned into three sections: a pre-disturbance section, a disturbance section, and post-disturbance section. The term "pre-disturbance section" is also referred to herein as "pre-transient section." The term "disturbance section" is also referred to herein as "transient section." The term "post-disturbance section" is also referred to herein as "post-transient section." In embodiments, the disturbance section is a cycle of the waveform that includes a detected disturbance in the waveforms, plus and minus a threshold number of cycles. For example, the pre-disturbance section may be defined by the waveform cycles up until a first number of cycles prior to the cycle of a disturbance (also referred to as a "pre-disturbance threshold"). The post-disturbance section may be defined by the waveform cycles after a second number of cycles past the disturbance (also referred to as a "post-disturbance threshold"). The disturbance section may be the waveform period between the pre-disturbance threshold and the post-disturbance threshold.

Block 359 may further include disqualifying certain waveforms received. Since e-field sensors may pick up noise and interference from adjacent conductors and objects, a basic qualification based on the Total Harmonic Distortion (THD) is beneficial. THD may be calculated based on Equation 1, below. Additionally, or alternatively, the standard deviation (STD) of the cycle-to-cycle root mean squared (RMS) version of both e-field and current in the pre- and post-event segments is taken as the qualification criterion as expressed by the following equations.

$$THD_E = \frac{\sqrt{E_2^2 + E_3^2 + \ldots + E_{20}^2}}{E_1} \qquad \text{Equation 1}$$

$$STD_E = \sqrt{\frac{1}{N-1}\sum_{i=1}^{N}\left(RMS_{Ei} - \overline{RMS_E}\right)} \qquad \text{Equation 2}$$

$$STD_I = \sqrt{\frac{1}{N-1}\sum_{i=1}^{N}\left(RMS_{Ii} - \overline{RMS_I}\right)} \qquad \text{Equation 3}$$

where E represents the e-field RMS, I is the current RMS, $E_i$ is the magnitude of the ith harmonic for the e-field signal, N is the number of cycles in the pre- or post-transient segment, $RMS_{Ei}$ is the RMS value of the ith cycle in the e-field waveform, $RMS_{Ii}$ is the RMS value of the ith cycle in the current waveform. $\overline{RMS}$ is the average RMS over N cycles.

The pre-processing block 359 may further implement feature extraction on one or more of the pre-disturbance, disturbance, and post-disturbance sections. Extracted features may include one or more of: e-field rise, e-field drop, current rise, current drop, power factor correction, real-power variation, reactive power reduction, reactive power increase, APQ change, inrush current, e-field oscillation, current oscillation, e-field drop, current rise, e-field RMS, E-field STD, Current RMS, Current STD, e-field apparent power (average, max, min, etc.), e-field real power (Average, max, min, STD), e-field reactive power (Average, max, min, STD), E-I phase (Average, STD), peak counts per cycle, [ΔPQ] to measure the ratio of real and reactive power change (as calculated using equation 4, below), etc.

$$\Delta PQ = \frac{P_{post-transient} - P_{pre-transient}}{Q_{post-transient} - Q_{pre-transient}} \qquad \text{Equation 4}$$

In block 360, the process 350 analyzes each of the e-field data 214, the current data 216, and the location/time stamp 217, either in raw format or in the pre-processed format after block 359 (e.g., segmented data, or feature-extracted), using a machine learning algorithm to determine status and event of the power network. The machine learning algorithm may be a classifier that extracts key characteristics (as discussed below) of the e-field and current data, and compares those key characteristics to a library of recorded characteristics used by a predictive model (such as that generated using process 370, as discussed below with respect to FIG. 5).

Based on the output of the algorithm analysis in block 360, in block 362, the process 350 outputs status information. In one example of block 362, the event labels 330 are generated. As discussed above, each line sensor 106 may include one e-field sensor 204 and one current sensor 206 for sensing the power line 104, whereby server 150 receives e-field data 214 and current data 216 for each power line 104(A), 104(B), and 104(C). In such case, block 360 may be implemented for the electric field and current data from each pair so that a first status, second status, and third status are generated, each of the first, second, and third status indicating status of a respective one of the three phases. Block 362 may further include transmitting the status to an external device, such as the SCADA 152 or other device (e.g., mobile device such as a phone, computer, or tablet) used by an operator of the system 100.

In embodiments, the process 350 may be initiated actively by the SCADA 152, such as upon a control signal by the SCADA to control other equipment of the power network. In embodiments, the process 350 may be initiated passively, such as by monitoring waveforms generated by the line sensors 106, and reacting to identified transient events therein.

Figure 5:
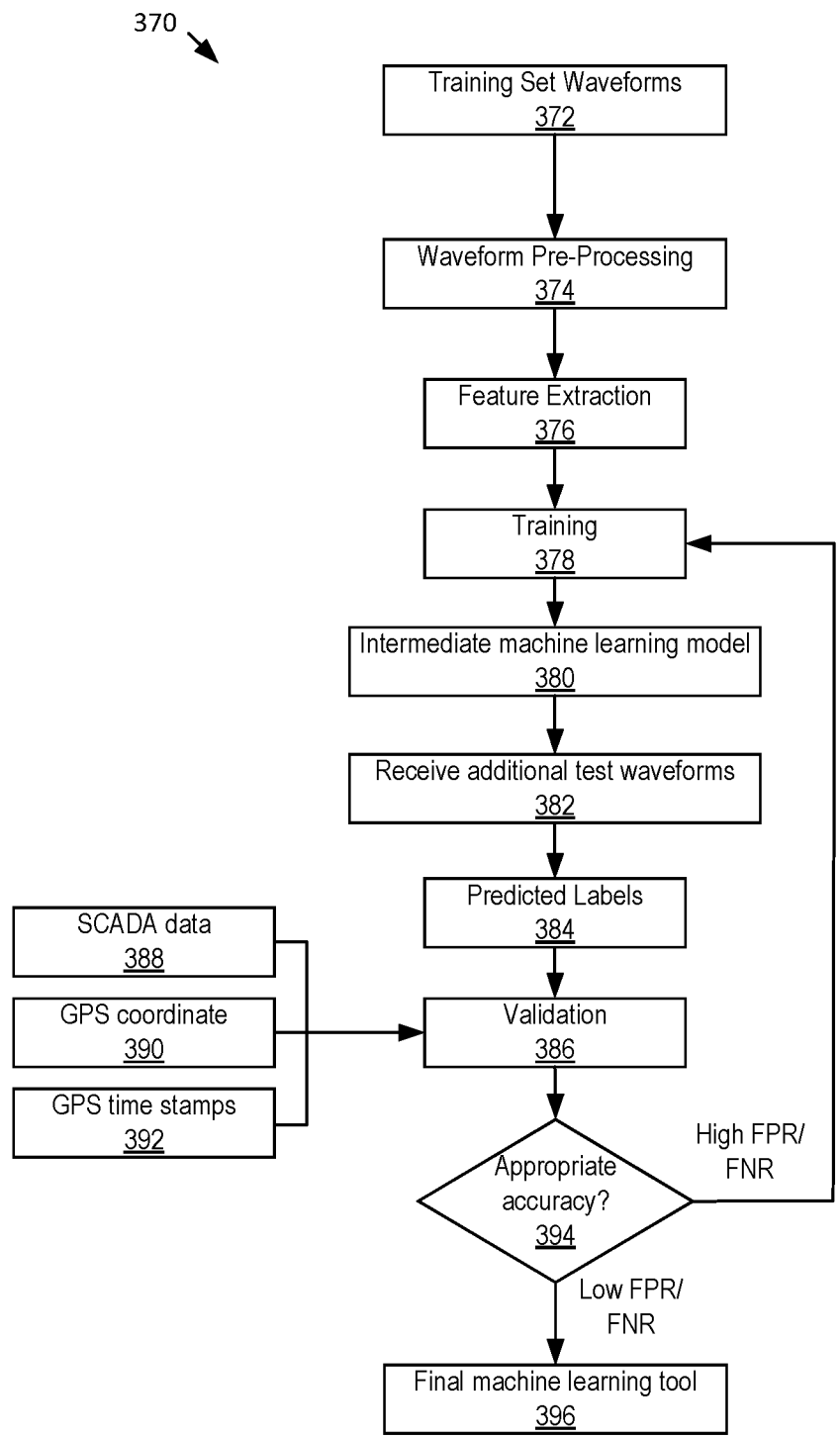
FIG. 5 depicts one example process for processing the disturbance data received from the line sensors of FIG. 1, in embodiments.

FIG. 5 depicts one example process 370 for processing the disturbance data 213 received from the line sensors 106. The process 370 may be implemented in the analyzer 322 of FIG. 3, for example. The process 370 may be invoked by block 360 of FIG. 4, in embodiments. Process 370 may be implemented, for example, via execution of the instructions forming the analyzer 322. Alternatively, the process 370 may be implemented external from the analyzer 322, such as in the "cloud" and the output classifier is then transmitted to the analyzer 322.

In block 372, a training set of waveforms is received. In one example of block 372, at least one set of e-field data (e.g., e-field data 214), and current data (e.g., current data 216) is received by the analyzer 322 from the line sensor(s) 106, where the set of e-field data and the current data are indicative of a disturbance or fault. In certain embodiments, a domain expert and/or the SCADA 152 may initiate block 372 in response to a known fault by associating the set of e-field data and the current data with the known disturbance or fault. The association allows for a supervised learning algorithm implemented by process 370. Compared to voltage-based classification approaches, the e-field-based approach requires a higher degree of training data to adequately represent the expected variation in the e-field waveforms across multiple regions and seasons. As discussed above, e-field waveforms are more susceptible to outside forces influencing the generated waveform.

In block 374, the process 370 pre-processes the training set received in block 372. In one example of block 374, the e-field and current waveforms are segmented into a pre-disturbance, disturbance, and post-disturbance sections, similar to block 359 discussed above. In block 374, the process 370 may disqualifying certain waveforms received. Since e-field sensors 204 may pick up noise and interference from adjacent conductors and objects, a basic qualification based on the Total Harmonic Distortion (THD) is beneficial. THD may be calculated based on Equation 1, above. Additionally, or alternatively, the standard deviation (STD) of the cycle-to-cycle root mean squared (RMS) version of both e-field and current in the pre- and post-event segments is taken as the qualification criterion as expressed by equations 2-4, above.

In block 376, the process 370 implements feature extraction on one or more of the pre-disturbance, disturbance, and post-disturbance sections identified in block 374. Extracted features may include one or more of: e-field rise, e-field drop, current rise, current drop, power factor correction, real-power variation, reactive power reduction, reactive power increase, ΔPQ change, inrush current, e-field oscillation, current oscillation, e-field drop, current rise, e-field RMS, E-field STD, Current RMS, Current STD, e-field apparent power (average, max, min, etc.), e-field real power (Average, max, min, STD), e-field reactive power (Average, max, min, STD), E-I phase (Average, STD), peak counts per cycle, [ΔPQ] to measure the ratio of real and reactive power change (as calculated using equation 4, above), etc.

In block 378, the process 370 uses the extracted features from block 376, the process 370 trains an intermediate machine learning model. In block 380, the process 370 outputs the trained intermediate machine learning model. The intermediate machine learning model maybe based on a variety of machine learning algorithms, including but not limited to: nearest neighbors, support vector machine (SVM), decision tree, random forest, neural net, AdaBoost, quadratic discriminant analysis, and naïve Bayes learning models. In one embodiment of blocks 378 and 380, the intermediate machine learning model output is a AdaBoost classifier with a three-layer decision tree as the base estimator. This configuration of the intermediate machine learning model provides a stable and more accurate classifier as compared to other machine learning techniques. This configuration reduces false positive rate reduction more than false negative rate and requires less labeling of the field data (e.g., less confirmation, via human or SCADA implemented, of disturbances and event correlating to the training waveforms). Furthermore, ensemble classifiers, such as AdaBoost utilize voting mechanisms that handle cases close to the decision boundary better by considering information from multiple weak classifiers.

In block 382, the process 370 receives additional test waveforms. These additional waveforms may be unlabeled test sets of e-field data and current data received from the line sensors 106. In block 384, the process 370 applies the intermediate machine learning model generated in block 360 to the additional test waveforms from block 612, and outputs predicted labels.

The process 370, in block 386, then compares the predicted labels against SCADA data received in block 388, location information received in block 390, and time stamps received in block 392 corresponding to the additional test waveforms received in block 382 to verify whether the prediction of block 384 is accurate. In one example of block 386, three conditions need to be satisfied to verify positive labels of the test data. The first condition is that the SCADA timeframe in the SCADA data received in block 388 matches the waveform time stamp. The second condition is that the disturbance occurred within a certain distance (usually <2 km) from the sensor 106 producing the additional test waveform received in block 382. The third condition is that the waveform features sufficiently match the key features identified in the intermediate machine learning model generate in block 380. Furthermore, in certain embodiments, since one disturbance may be detected by multiple sensors, the false negative cases may be determined by time correlating results from the nearby line sensors 106 using the true positive cases. The use of GPS chipsets to provide timestamping of the provided data from the line sensors 106 enables the system to have appropriately accurate and synchronized timing data to enable accurate correlation of data from various ones of the line sensors 106.

Block 394 is a decision. If, in block 394, it is determined that the intermediate machine learning model is appropriately accurate (e.g., whether the false-positive rate (FPR) and false-negative rate (FNR) are adequate based on the validation performed in block 386), the process 370 continues with block 396; otherwise, the process 370 continues with block 378. The objective of the prediction is to achieve a low false positive rate (FPR) as the first priority and a low false negative rate (FNR) as the second priority. If the prediction results are not satisfactory, the process 370 reiterates the training at block 378 using adjusted training data or training labels. When the prediction results are accurate, in block 396, the process 370 outputs a trained classifier. This trained classifier may be used in block 360 of process 350 to analyze received e-field data received in block 352 and current data received in block 354 that generates labels in block 362.

The output trained classifier may be transmitted to server 150 (or otherwise stored thereon if created at server 150) for analysis of received data from line sensors 106 by the analyzer 322. The output trained classifier may include a library of recorded characteristics Furthermore, in embodiments where the line sensors 106 include functionality of the analyzer 322, the output trained classifier may be converted into a different format (e.g., from Python to C programing languages) to allow the line sensors 106, either individually or collectively as a distributed computing system, to implement the machine learning algorithm. In embodiments, the converted format may include one (or more) predictor functions, and a plurality of weak estimator functions, where the confidence of each of the predictor function and the weak estimator functions are combined into a disturbance event confidence, and compared to a confidence threshold for a given event. If the disturbance event confidence is above the threshold, then the line sensor 106 (or plurality of line sensors 106) would generate an alert 230 indicating the detected event.

Figure 6:
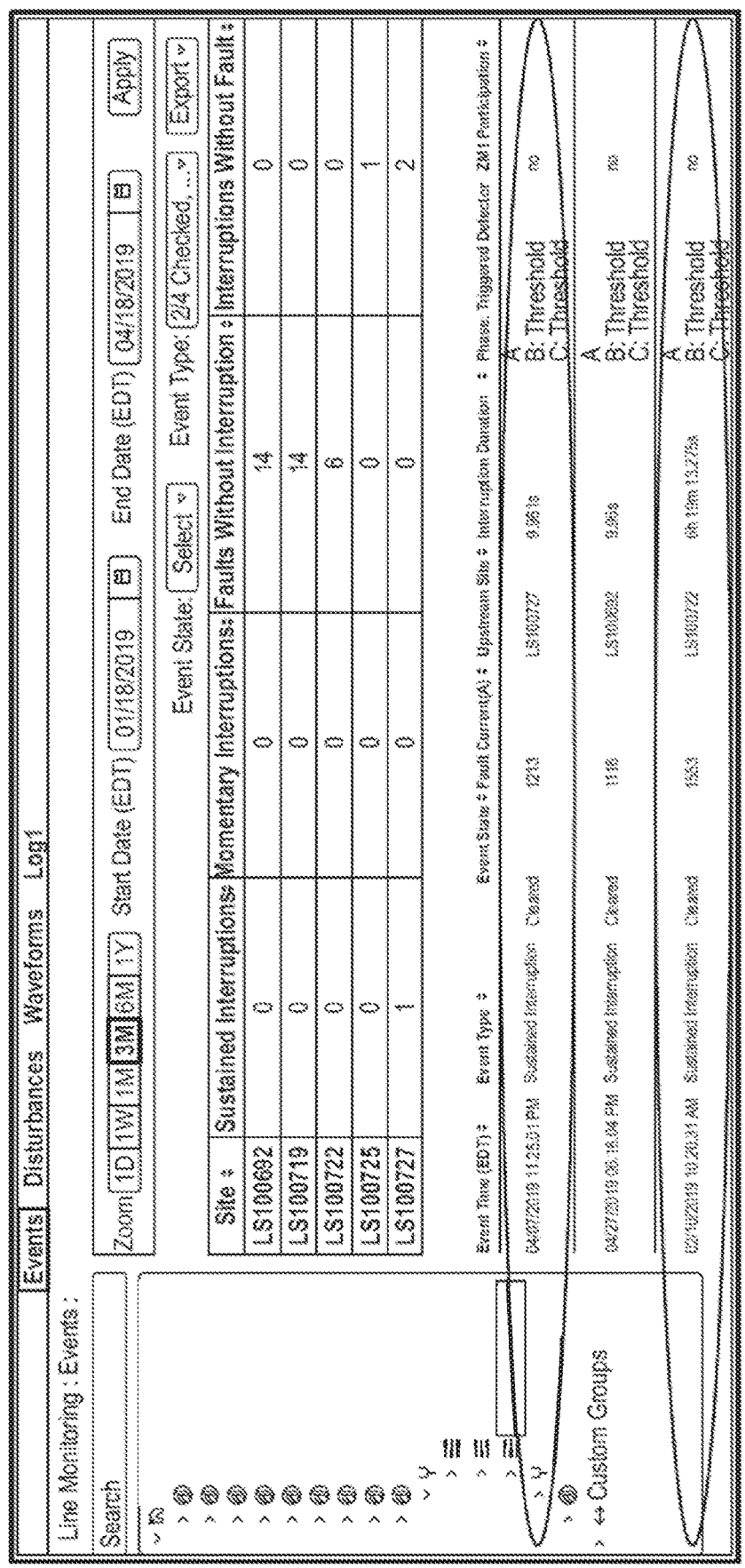
FIG. 6 is a screenshot showing one example output of a sustained interruption from the system of FIG. 1, in embodiments.

FIG. 6 is a screenshot 400 showing one example output from the system 100, based on the software modules and line sensors 106, working on a feeder location. The screenshot 400 illustrates how line sensors 106 and the software modules 220 and/or 320 were able to detect and monitor (a) a sustained interruption on February 10th at 10:30 AM that lasted over 6 hours, and (b) that two months later, on April 7th at 11:25 PM at night, another 9.9 sec sustained interruption was detected at the same location (e.g., on the same feeder). This information in a repeated pattern may be enough to merit scheduling of an inspection truck to that location to evaluate potential vegetation incursion and/or grid equipment in pre-failure mode, thereby preventing a potential wildfire ignition from a more serious fault. Although many grid ignitions do not create a fire, by tracking these momentary faults and smaller disturbances, the system 100 may mitigate risk of wildfires.

By detecting and reporting on momentary events (e.g., power line 104 disturbances) that are transient in nature (e.g., captured as disturbance data 213 by the line sensor 106), the system 100 provides useful information that allows utilities to reach a higher level of reliability and availability. Regulators, until recently however, have not always incentivized utilities to capture and record safety metrics. The system 100 facilitates reporting, mitigating, and managing the number of momentary events on each circuit to proactively help utilities better target their vegetation control efforts. By capturing and managing momentary events detected within the power grid, the system 100 allows utilities to optimize investment in deploying the right intelligent control devices in critical areas to improve grid sectionalization. By monitoring these momentary events and disturbances, the system 100 helps grid resilience and improves targeted de-energization efforts in case of a sudden wildfire.

Figures 12, 13:
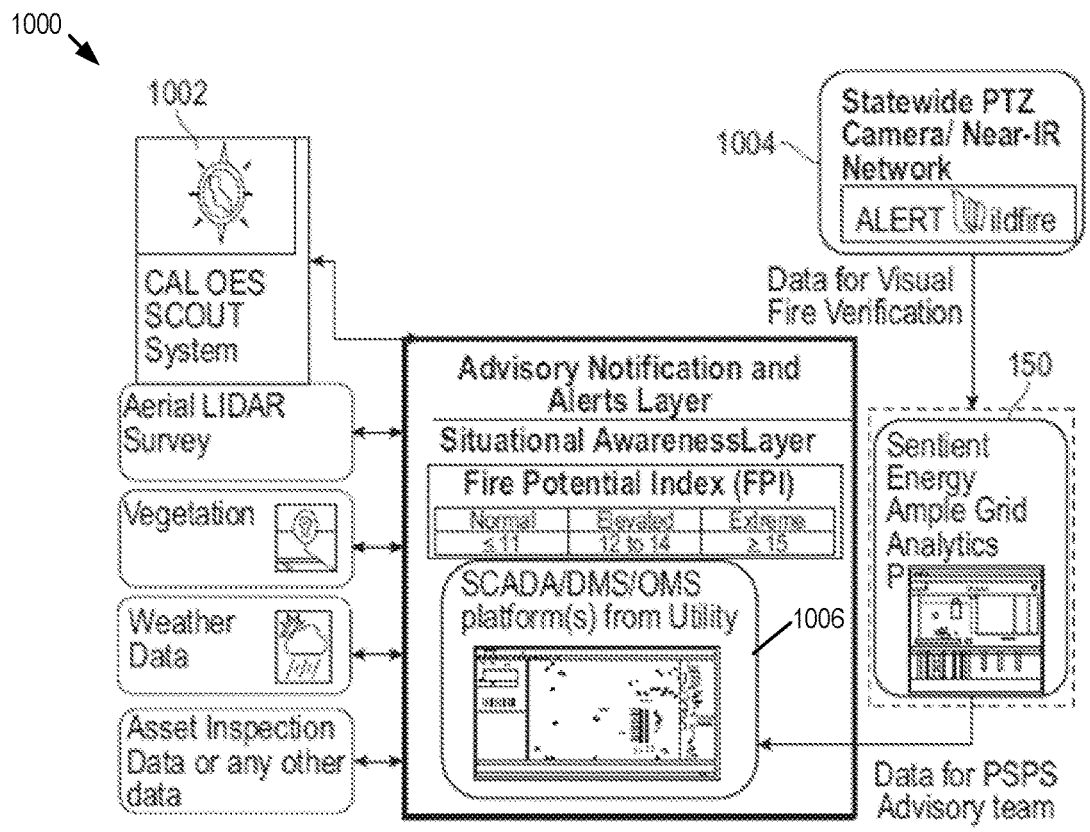
FIG. 12 is a schematic diagram illustrating a deployment architecture of an overall Situational Awareness Platform that received input from the system of FIG. 1, in embodiments.
FIG. 13 is a table showing example Grid Ignition Source Detection Key Performance Indicators that help significantly improve vegetation/grid management and wildfire risk operations by the system of FIG. 1, in embodiments.

Disturbances are defined as unexpected deviations in the current and/or the e-field waveforms that last a few cycles or more. Disturbances may be long in that they trigger actions with regard to shutting down the power grid near the disturbance location, or short in that the disturbance does not trigger actions by automation and control infrastructure. These disturbances may be low or high current and are highly indicative of pre-fault and developing conditions on the grid. The system 100 and methods described herein enable Grid Ignition Source Detection (GISD) by capturing disturbance data 213 corresponding to these unexpected deviations in the current and/or the e-field waveforms. As shown in FIG. 3, the analyzer 322 may include a GISD software module 324 that implements GISD. The software 320 may also include an awareness platform 326 that processes the event labels 330 and corresponding disturbance data 213 to generate analytic and awareness data 332 the define a status of the grid network and include predictions of faults based upon detected disturbances data 213 and corresponding event labels 330. The awareness platform 326 may also provide analytic awareness data 332 to other entities and platforms to enable them to combine information of the faults and disturbances in the grid network with other data, as shown in FIG. 12, for example.

GISD solutions fall in the category of predictive analytics and pre-emptive actions specifically focused on grid ignitions that impact the electric grid from a reliability and safety perspective. Predictive analytics applied at the appropriate time and location on the electrical grid help identify and prevent ignitions that can cause wildfires initiated by the power infrastructure.

Distribution power lines are where the majority of the wildfires that impacted utilities (e.g., PG&E in California) and its customers started especially in the Wildland-Urban Interface (WUI) cities in the High Fire Threat Districts (HFTD) areas. The GISD software module 324 potentially saves the monitoring entity a lot of money and time by implementing the following: 1) Target vegetation encroachment areas and optimize the Enhanced Vegetation Management spend of millions of dollars a year on repetitive, operational expenditures that can be prioritized for targeted areas. 2) Accelerate the locational targets based on frequency of outages and disturbances where billions would be needed for grid hardening capital investments such as undergrounding or covered conductors that take years to deploy over the service territory of the electric utility. 3) Help grid planning and reliability engineers inside electrical utilities target the locations and optimize the burden on the taxpayer with respect to the millions of dollars a year needed for grid sectionalization by using intelligent control devices only where the case for improved reliability or resilience clearly exists. 4) Provide grid situational awareness and context to the network of cameras, vegetation/inspection surveys and weather stations that are generally reactive. 5) Provide critical locational awareness and context to the first responders.

Within the system 100, the GISD software module 324 provides a starting point that enables predictive wildfire management in which grid-caused ignition sources may be identified and remedied before they develop into a potential wildfire risk factor. The electrical grid is a fixed frequency (e.g., 50 or 60 cycles/sec), real-time, electrical network that includes many normal grid activities such as motor starts, load shifts and load characteristics. These normal grid activities cause small deviations in load that are typically not detected by typical distribution protective equipment. However, the line sensors 106 described herein may be configured to detect such disturbances (e.g., captured as disturbance data 213 by the line sensor 106). Other disturbances, not related to normal grid activity, may be precursors to momentary faults or equipment failures that may produce spark ignitions. By leveraging high resolution oscillography in the line sensors 106 described herein (typically 128-130 samples per cycle or 7800 samples per second, but up to 256 samples per cycle or 15,360 samples per second) coordinated with precision accuracy time stamps generated by the positioning interface 202 that include on-bard GNSS units, the line sensor 106 may detect very small deviations in load, harmonics to the 31st level that may correspond to normal and abnormal grid disturbances and events.

Figure 7:
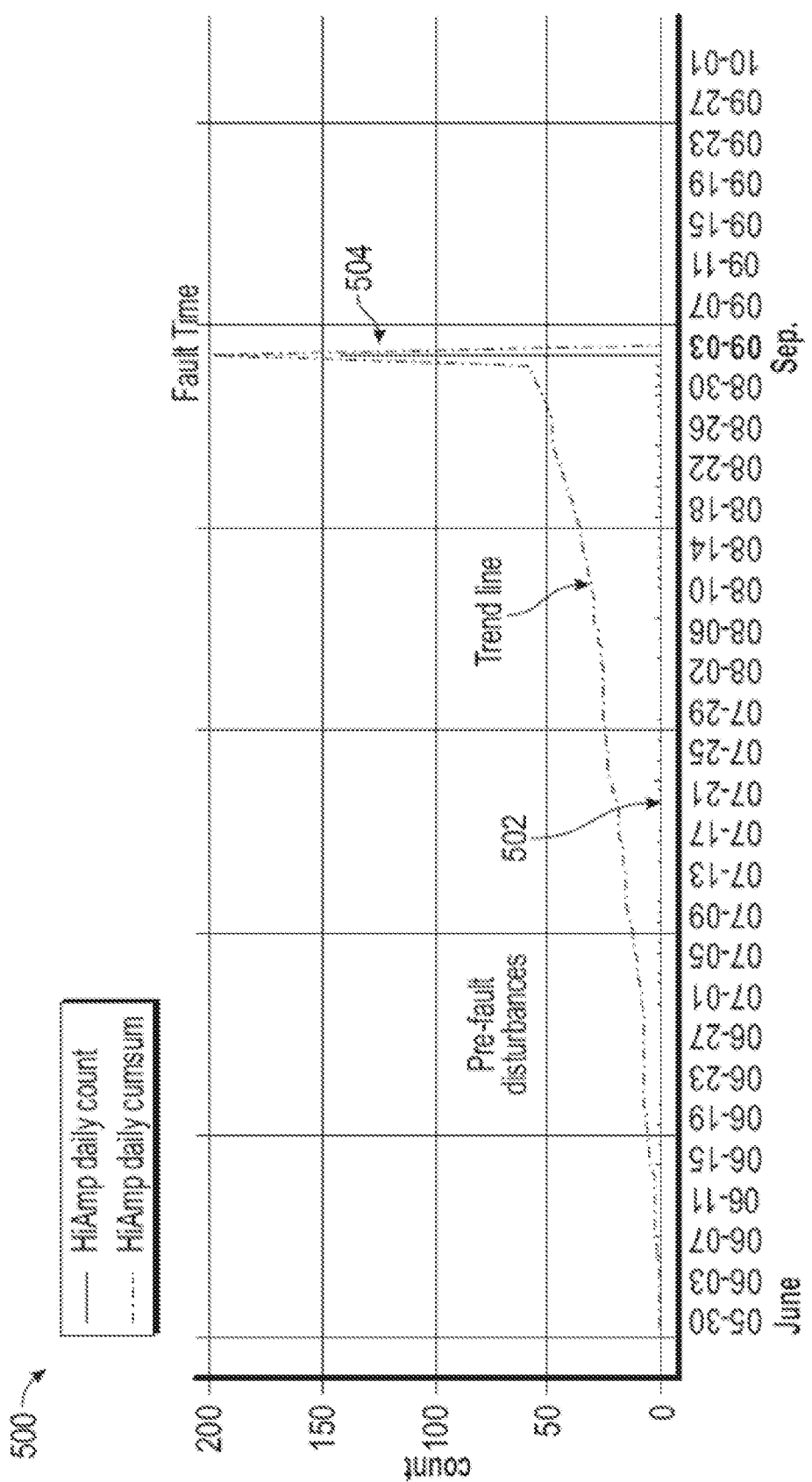
FIG. 7 shows one example output of the system of FIG. 1, illustrating power grid disturbance captured by one line sensor, in embodiments.

FIG. 7 shows one example output 500 of the system 100 of FIG. 1, illustrating power grid disturbance 502, captured by one line sensor 106, leading up to a sustained fault 504. With public safety and wildfires as a focus, a key feature of the line sensors 106 and the supporting Grid Analytics System platform software (e.g., software 220 and software 320) is the measurement of transient disturbances on the power lines 104 that may lead to ignition causes. These disturbances 502 may have a duration of a few milliseconds and may be either low or high current, depending upon the cause of the disturbance (e.g., a type of event it represents). These transient disturbances are full of valuable signals that need to be analyzed for potential wildfire risk detection. In particular, FIG. 7 is a histogram plot showing the pre-fault signals (e.g., disturbances 502) before the actual large fault 504 takes place.

Figure 8:
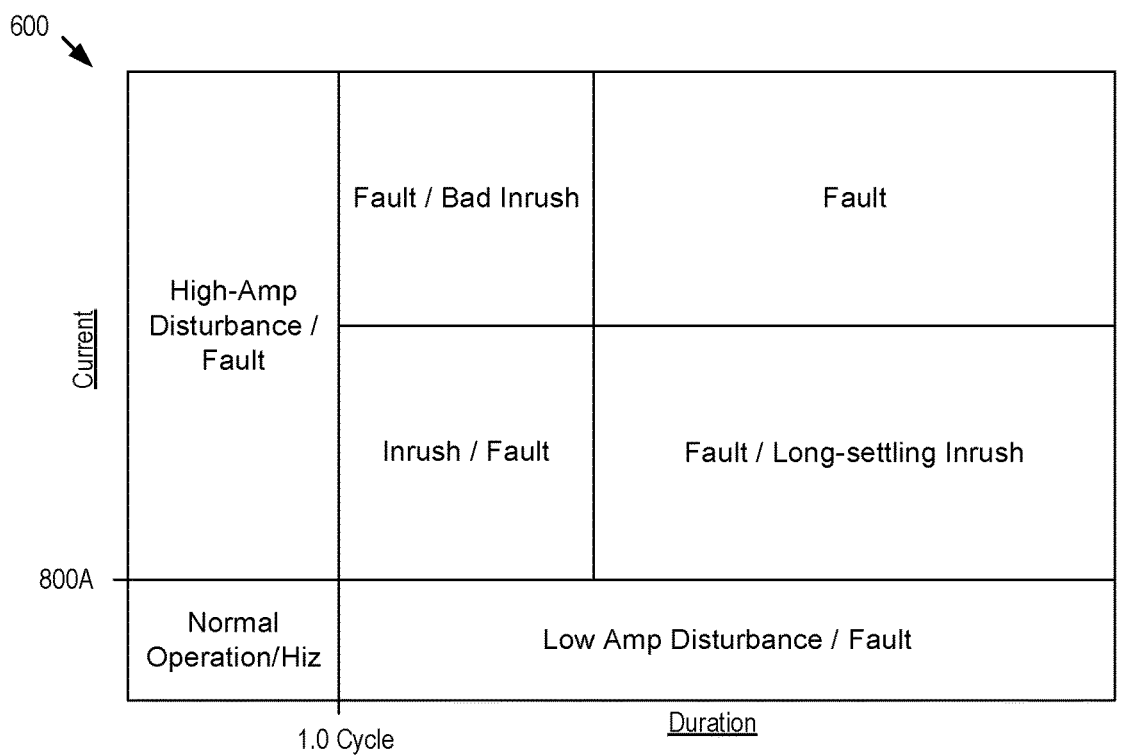
FIG. 8 is a graph illustrating a range of disturbances and faults that the system of FIG. 1 is configured to detect and analyze, in embodiments.

FIG. 8 is a graph 600 illustrating a range of disturbances and faults that the system 100 is configured to detect and analyze. The graph 600 has a vertical axis representing current and a horizontal axis representing duration, where the lower left corner area 602 represent normal operation where current is less than eight hundred amps, and disturbance duration is less than one cycle. By measuring high fidelity signals at a relatively high sampling rate uniquely enables system 100 to monitor signals and populate graph 600 continuously for customers.

Figure 9:
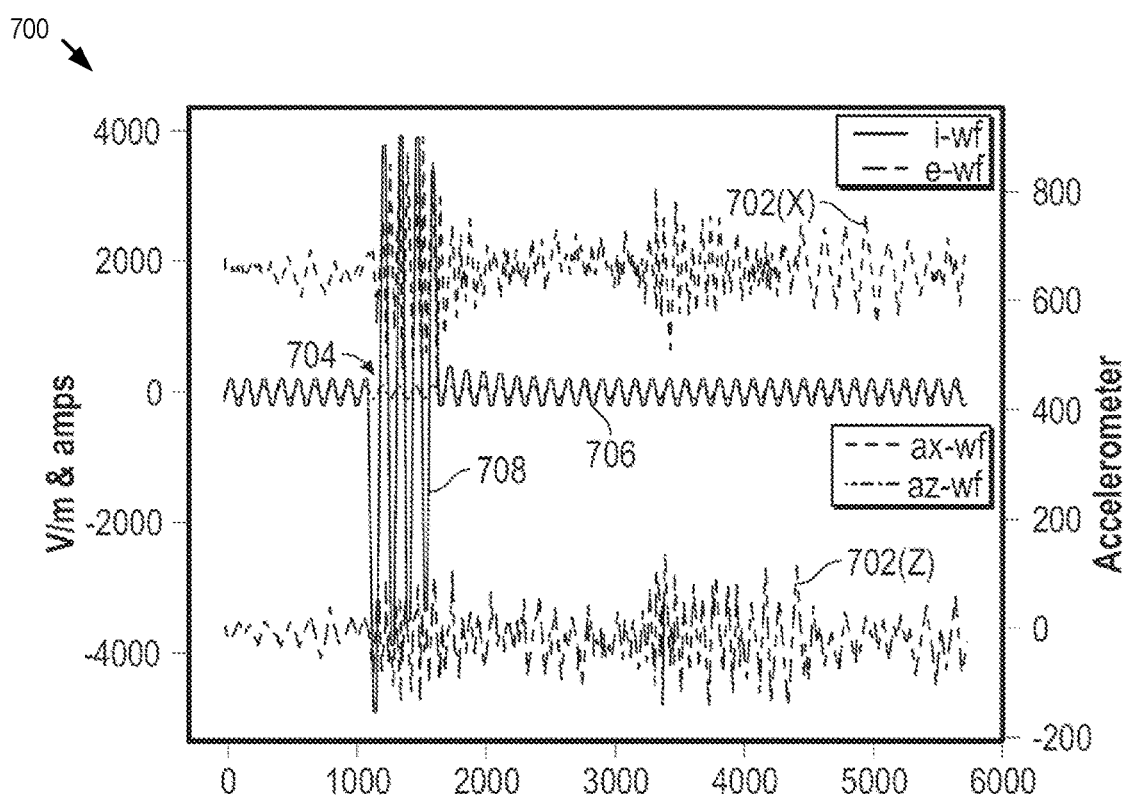
FIG. 9 is a graph illustrating a correlation in accelerometer data and detected movement of the power line, in embodiments.

The system 100 uses the plurality of line sensors 106 distributed across the electrical grid to capture and detect disturbances and events in real-time as they occur, using the GISD software module 324 and the associated capabilities described herein. The line sensor 106 may be mounted on the power line 104 in a matter of minutes without needing to de-energize the power line 104. The line sensor 106 provides continuous monitoring of the power line 104 such that the system 100 may determine power quality from a reliability and safety perspective for the grid operators and first responders alike. As described above, the line sensor 106 senses e-field and current to capture fault and non-fault disturbances continuously on the overhead distribution power lines 104. The line sensor 106 may also include at least one accelerometer that enables the line sensor 106 to detect movement of the power line 104 to which it is attached. FIG. 9 is a graph 700 illustrating a correlation in accelerometer data 702(X) and 702(Z) corresponding to detected movement of the power line 104 by the line sensor 106 positioned downstream of a location of a disturbance 704 detected in e-field 706 (e.g., determined from captured e-field data 214) and current 708 (e.g., determined from captured current data 216) by the line sensor 106. Advantageously, the GISD software module 324 may uses this correlation between e-field, current, and movement to help identify a cause (e.g., high winds moving the power lines) of the disturbance 704.

Figure 10:
FIG. 10 is a chart illustrating example grid ignition sources detected by the system of FIG. 1, in embodiments.

Continuous line monitoring by GISD software module 324 helps detect multiple sources of grid ignitions that could lead to fires. FIG. 10 is a chart 800 illustrating example grid ignition sources, detected by the system 100 of FIG. 1, that include: 1) Vegetation: Vegetation incursion on power lines; 2) Conductor: Conductor connector/coupling/splice failure over time; 3) Grid Equipment: pre-failure disturbances on pole-top transformers, Capacitor banks, fuses, insulators, switches, etc.; 4) Winds: Conductor sways and conductor slaps, especially in high wind conditions that create fire ignitions; and 5) Animal: bird/animal contact on power lines that create faults, etc. The effectiveness of the system 100 for detecting a potential grid ignition event varies for each of these grid ignition sources listed in the chart 800. As described above, the system 100 includes machine learning that refines, filters, and synthesizes detected disturbances (e.g., creating fault signatures 224 for each of the grid ignition sources listed in the chart 800) that allow each line sensor 106 and/or analyzer 322 to generates actionable advisory signals (e.g., alert 230) that may be sent to the first responders and utility control devices to proactively mitigate these disturbances before they become ignition incidents. Advantageously, the system 100 prevents wildfires by continuously monitoring the power lines 104, using line sensors 106, to detect the disturbances in real-time.

As is evident from FIG. 10, the value of this granular grid data and associated analytics by the system 100 is immense to Grid Reliability and Planning officials from regulated utilities. In addition, first responders who are rushing to save human lives, property and forests from these precious fires are also valuable stakeholders here since fire prevention is a critical value-added service to fire fighters, as is safe, proactive grid de-energization in areas that fire has broken out so contact of fire with power lines does not compound an existing problem. GISD by the system 100 enables more accurate location tracking including validating wind impact on lines and associated equipment optimizes the fire-fighting efforts along with supporting emergency operations.

Proactive grid monitoring by the system 100 offers utilities and first responders' proactive ability to manage their forest vegetation and target their efforts throughout the year to stay on top of vegetation management rather than just scheduled monitoring. Proactive grid monitoring by the system 100 also provides asset management functions for the power utilities that allows them to fix electrical assets on the grid before they fail and cause fires. The proactive grid monitoring of the system 100 also provides predictive monitoring that gives utilities and responders a chance to get ahead of wildfires. Proactive grid monitoring by the system 100 also allows utilities to decide where to de-energize the grid based on high winds causing conductors to sway, thereby preventing conductor slaps and associated arcing that may cause fires. System 100 thereby helps to save human lives, public property, protects lives of first responders, and also protects forests from avoidable grid ignitions and catastrophic fires.

Figure 11:
FIG. 11 is a chart illustrating wildfire risk mitigation economics.

Identification of location and likely ignition allows for emergency response teams to be on site much more quickly and have a much better understanding of the developing situation, resulting in increased safety for the emergency response teams, utility crews, and the general public. Millions of dollars may be saved from unnecessary truck rolls and potentially the highest savings is the reduction in unnecessary loss of life. Savings from property damages may be in the millions of dollars. In addition, utilities may leverage the technology of the system 100 to provide power not only more safely but also more reliably. Truck roll minutes alone could provide >50% of the savings for the Utility. This is important since de-energizing the grid needs correct mapping of the three phases first and many utilities do not have 100% accuracy here as well, and the solutions provided by the system 100 are the best way to correct these errors. FIG. 11 is a chart illustrating Ignition Prevention Economics.

From a public health and environmental impact perspective, it is important to mention that the line sensors 106 do not have significant environmental toxicity impact given it is mostly electronic circuitry and mechanical parts inside a plastic housing, which may be salvaged and recycled at the end of its useful life. The consumer barely notices the presence of these devices on their power lines and the first responders have an ability to collaborate with an awareness platform 326 and the Local utility control operations centers that use the system 100 to see ignition activity on the grid to take proactive corrective action, a new capability that drives personnel safety and better collaboration with other first responders.

The ultimate solution is a rich library of GISD algorithms sitting on top of the sensor and ample software network that continuously refines the disturbance counts, filters the disturbances based on situational context and synthesize the disturbance signals into actionable local advisories that are parsed into the hands of the right first responder team in the right region. Using the GISD, the power grid may be automatically controlled, such as via inclusion of a Power Safety Power Shutoff (PSPS) recommendation (or control signal) to the utility's ADMS/SCADA control software that initiate the PSPS process using software to the intelligent control devices on the grid or to help them roll utility trucks to remedy the issue causing the disturbance before it turns into a fire. The system 100 may implement may different algorithms for detecting GISD, including: 1) A vegetation incursion on a line causes sudden but regular momentary disturbances especially as the winds pick up. Fire crew can be notified to go to the area and perform vegetation trimming before the tree branch catches fire. 2) A conductor coupling or a failing insulator will emit sustained disturbances for days/weeks before it fails creating a high current arc or sparks that could ignite local vegetation causing a fire. 3) High Santa Ana winds (>25 MPH) are being detected for over 10 minutes on a feeder. The system puts the feeder on the watch list to look for wind gusts (>40 MPH) at which time the system monitors the conductor sway and alerts the utility control center when the conductor sway is logged at >1 ft. (normal distance between two conductors is 3 ft.). The utility wildfire safety control center (WSOC) can then coordinate with emergency response teams to decide readiness to manage a local rural hospital in case of emergency power de-energization (PSPS) program.

Utility control operators can use their ADMS/SCADA platforms and/or integrate with the awareness platform 326 as the main integrators of the grid ignition insights coming from our Ample platform working with either the state's regulated electric utilities directly or through a leading system integrator.

FIG. 12 is a schematic diagram illustrating a deployment architecture of an overall Situational Awareness Platform 1000 for the State of California that received input from the system 100 of FIG. 1. It is possible that emergency responders and many utilities have their own individual version of this architecture and creating cross-organizational data connectivity will be key to seamless data sharing and first responder collaboration. The various systems that may be integrated to consume the alerts by the state of response team with this platform are the emergency response platform 1002 (e.g., CAL FIRE/CAL OES SCOUT), and ALERT Wildfire 1004: State of California's PTZ camera network (across the utilities and first responders in partnership with the University of Nevada, Reno).

The ALERT Wildfire fire camera platform now spans five western states with over two-hundred installs to date. With the recent installs of nearly one-hundred and thirty cameras in 2019, the total number of ALERT Wildfire cameras in the Golden State was one-hundred and seventy-four as of April 2019. The consortium of three universities—UNR, UC San Diego, and University of Oregon—provides access to state-of-the-art Pan-Tilt-Zoom (PTZ) fire cameras and associated tools to help fire fighters and first responders: 1) discover/locate/confirm fire ignition. 2) quickly scale fire resources up or down appropriately based on early intel. 3) monitor fire behavior through containment. 4) during firestorms, help evacuations through enhanced situational awareness. 5) ensure contained fires are monitored appropriately through their demise.

As a confirmation tool, ALERT Wildfire has already provided assistance to over 600 fires in the past 3 years, highlighting the utility of this growing system. The public is also invited to understand their own situational awareness, and possibility participate in fire watch programs spinning up throughout the state (i.e., essentially a 21st century crowd-sourced fire lookout tower platform). The ALERT Wildfire software API (application programming interface), which sits on top of the Axis camera own API, provides the opportunity to automatically move cameras toward a "target" of interest. This automatic pan-tilt-zoom function could be triggered by a 911 call, where an incident location is automatically grabbed from a text message generated from a CAD (computer-aided dispatch) system. This approach can also be applied to electrical system monitoring, where an electrical "fault" is recognized through the monitoring platform, triggering a predefined set of nearby cameras to be moved/zoomed-in to verify that the electrical fault or failure has not resulted in ignition. More transient electrical phenomena that may ultimately result in failure can be watched in a proactive fashion to ensure that even momentary faults do not result in a fire start. There is even the possibility that wire sway or potential slap can be confirmed from both line-sited accelerometers and cameras near power lines of concern. Together, this monitoring technology and the ALERT Wildfire platform can be fused to help get a jump, precious minutes, on wildfires related to failures of the electrical grid and associated systems.

The system 100 may enhance the Situational Awareness Platform 1000 by providing analytic awareness data 332 (e.g., GISD information related to the grid network and corresponding power lines 104) to the Situational Awareness Platform 1000. The approach to wildfire safety using GISD 324 operating within system 100 starts with rapid deployment of line sensors 106 in the two-hundred High Fire Threat District (HFTD) cities known in the state of California. As an example solution, deployment of line sensors 106 in the two-hundred HFTD areas in California could be deployed quickly on the power lines with cellular communications subscribed to, or owned by, the utilities and the platform (e.g., the functionality of server 150) described herein was quickly deployed in a hosted Cloud (like AWS) environment with built in high availability and disaster recovery to start monitoring the data flowing from these devices within 24 hours of installation.

Deploying this solution using a 3G/4G cellular provider like AT&T or Verizon is the fastest and most efficacious way to mobilize these deployments. However, the platform also implements a private cellular communication capability for use in rural/dense forest areas where cellular coverage may be weak or absent.

The solutions described herein also seamlessly work with existing SCADA software-based control center operators inside utilities to dramatically improve the effectiveness of communication between fire fighter administrative units, emergency response teams, and these utilities distribution operations. The Utility SCADA operators are the folks that de-energize the grid with their own trucks and technicians. These central operators can remotely control the grid by operating reclosers, circuit breakers etc. where intelligent distribution devices are available. In areas where there are no distribution automation devices, the utility field crew have to manually drive around pinpointing faults and failures and (re)/closing control devices where necessary. The fire fighter control room dispatches fire trucks, fire retardant helicopters and rescue crews to locations for Emergency Response. These solutions are a major asset for first responders by streamlining communications with utility operations and optimizing the predictive wild fire containment and vegetation management efforts.

Advantageously, system 100 enhances operation of the Situational Awareness Platform 1000 by providing real-time analytic awareness data 332 that may identify locations where a predicted fault may ignite a wildfire in the future, thereby allowing the FIG. 13 is a table showing example Grid Ignition Source Detection Key Performance Indicators (GISD KPIs) that help significantly improve vegetation/grid management and wildfire risk operations by the system 100 of FIG. 1. Across the state of California there are 40,000 miles of power lines/feeders which go through these 200 HFTD cities where our intelligent sensing network will live.

Conductor Fault Detection

Figure 14:
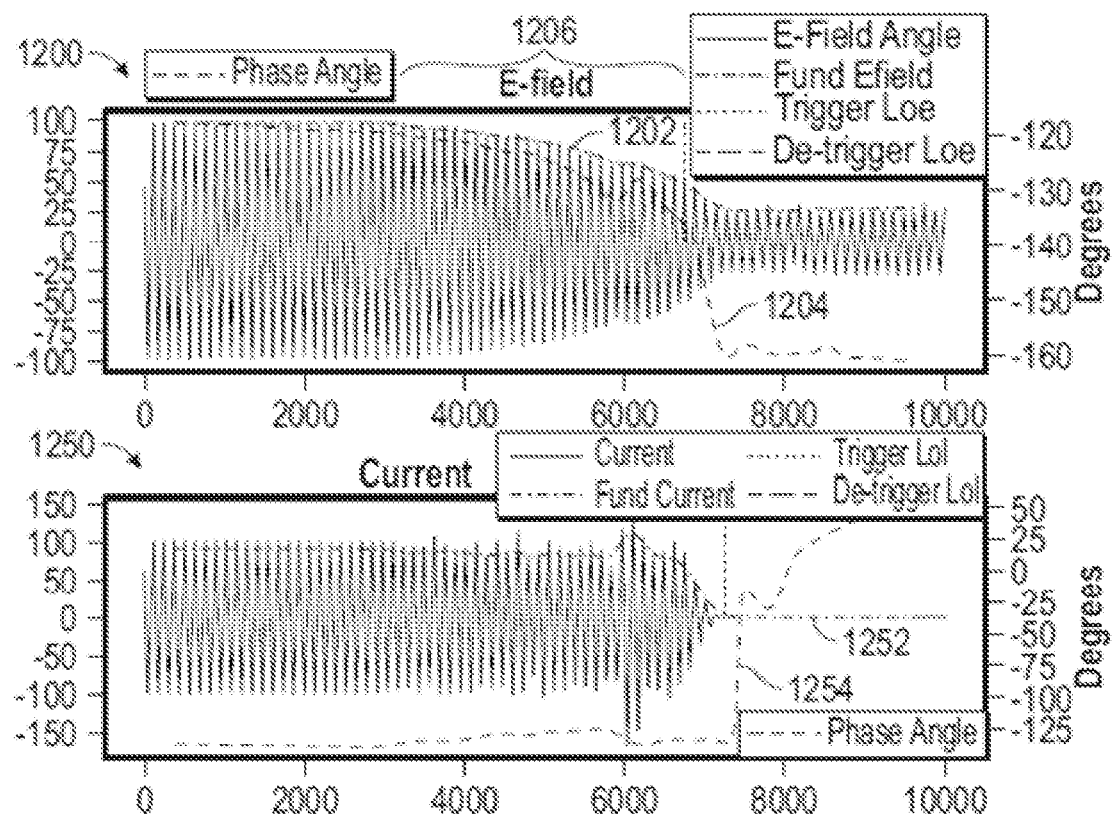
FIGS. 14 and 15 show example waveform graphs for e-field and current sensed by a line sensor of FIG. 1, in embodiments.
Figure 15:
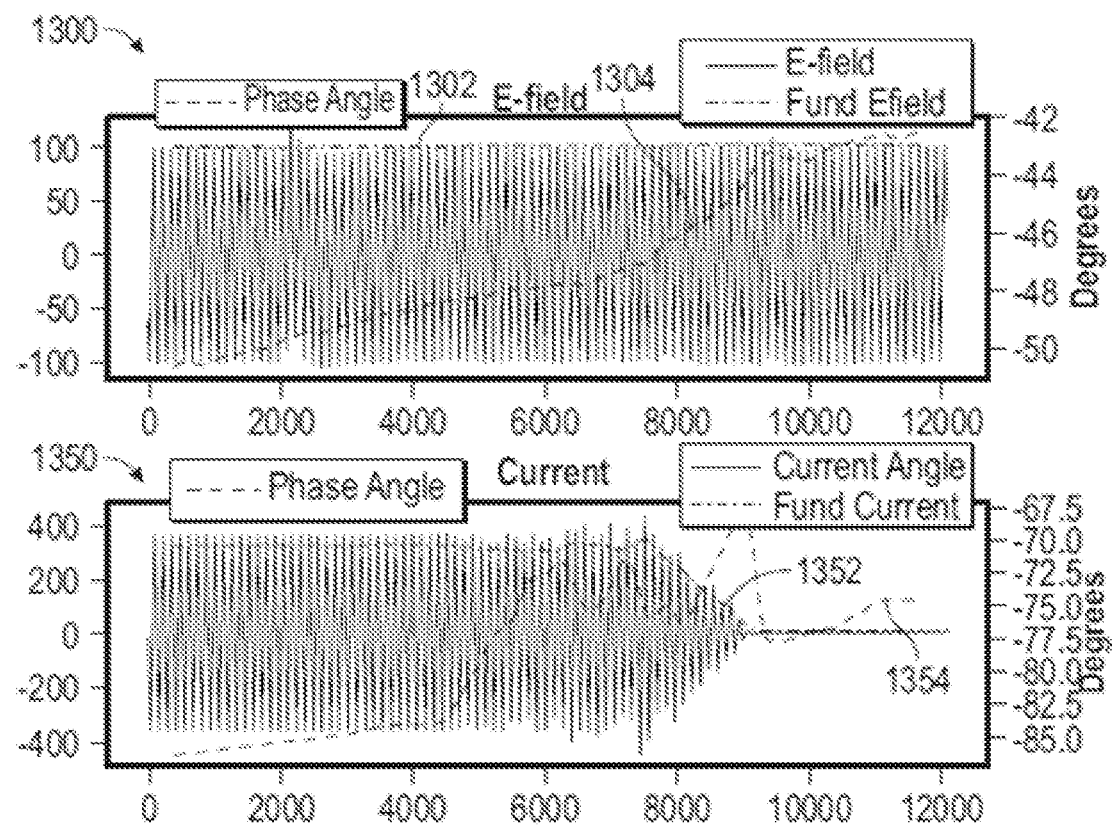

FIGS. 14 and 15 each show a pair of graphs of e-field data 214 and current data 216 sensed by line sensors 106 attached to one phase of the power line 104 when a line break 120 (see FIG. 1) occurred that did not result in protection equipment (e.g., protection devices 110, 112, 114 and 116) being activated. These graphs show actual data (fault signals) captured from an electrical power grid by line sensors 106. Since such line breaks may not activate protection devices (e.g., protection devices 110, 112, 114, and 116), the downed power line may remain energized and could ignite a wildfire. The fault signals depicted in each of FIGS. 14 and 15 represents a known fault occurring at on many locations on a power grid, for convenience, these fault signals are described with reference to the fault scenario shown in FIG. 1. The use of many different fault signatures 224 may improve performance of system 100, since this provides more opportunity for software 220 and/or software 320 to ignore noise in sensed data 214/216, while maintaining key attributes of detecting real disturbances and faults. The types of fault that may trigger a wildfire, detectable by system 100 are shown in FIG. 10. These faults include vegetation contact directly (e.g., branch of tree touching power line) or indirectly (e.g., broken branch flying into the live power line from a distance) may appear similar to each other in terms of disturbances sensed by line sensors 106. In another example, conductors slapping against each other create arcing and sparks that may ignite a wildfire. Although system 100 may detect mechanical disturbances due to conductor movement by wind gusts, system 100 may also detect electrical disturbances (e.g., distortion) in e-field as well as current. A fallen conductor, on the other hand, shows loss of current. System 100 may also detect unique signatures of disturbances in different types of equipment, such as caused by capacitor banks, reclosers, transformers, and so on. In another example, wind may cause mechanical disturbances detectable by system 100, such as sways, gallops, and so on, that are examples of more pronounced mechanical disturbances with unique signatures. System 100, by matching characteristics in one or both of e-field data 214 and current data 216, may also detect animal caused disturbances. For example, an animal (e.g., bird, squirrel, etc.) may hit a power line and the detected electrical and mechanical disturbances may provide additional information to help emergency responders and utility workers.

FIG. 14 shows an e-field graph 1200 and a current graph 1250 for e-field data 214 and current data 216, respectively, captured simultaneously by one line sensor (e.g., 106(3)(C) in FIG. 1) positioned downstream of line break 120. In e-field graph 1200, the fundamental amplitude (e.g., RMS value) of the e-field data 214 is indicated by line 1202, and the phase angle is indicated by line 1204. In current graph 1250, the fundamental current is indicated by line 1252, and the phase angle is indicated by line 1254.

FIG. 15 shows an e-field graph 1300 and a current graph 1350 for e-field data 214 and current data 216, respectively, captured simultaneously by one line sensor 106(2)(C) positioned upstream of line break 120. In e-field graph 1300, the fundamental amplitude of the e-field data 214 is indicated by line 1302, and the phase angle is indicated by line 1304. In current graph 1350, the fundamental current is indicated by line 1352, and the phase angle is indicated by line 1354.

Fault Signature Templates

Figure 16:
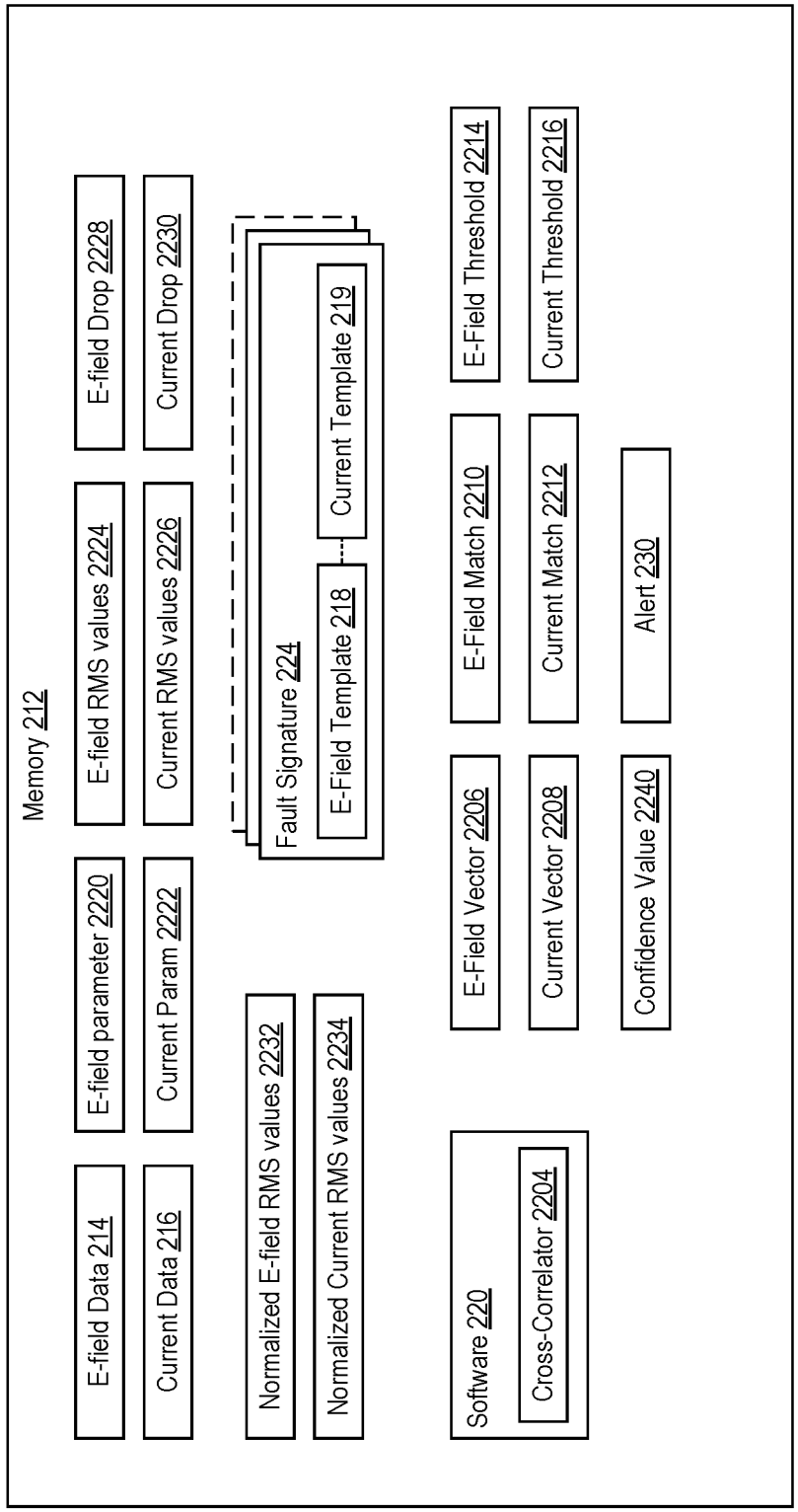
FIG. 16 shows the memory of the line sensor of FIG. 2 in further example detail, in embodiments.

FIG. 16 shows memory 212 of line sensor 106 of FIG. 2 in further example detail. For each of the fault signals depicted by FIGS. 14 and 15, the corresponding e-field data and the current data may be processed, within server 150 for example, to generate a corresponding fault signature 224 that defines the e-field template 218 and the corresponding current template 219 to allow the line sensor 106 to detect the corresponding line break 120. Once generated, fault signatures 224 are stored in memory 212 of each line sensor 106. In certain embodiments, server 150 may send fault signatures 224, via wireless communication interface 306 and wireless interface 208, to each line sensor 106 deployed within system 100. Server 150 may add, update, or delete fault signatures 224 at each line sensor 106 as needed (e.g., as new fault signatures 224 are discovered).

Key attributes of each fault signature 224, as shown in the graphs of FIGS. 14 and 15, include (a) a monotonic descent in e-field strength (when the line sensor 106 is downstream of line break 120), (b) a duration of the descent in e/i, and (c) low amperage "rain." Particularly, as shown in FIG. 14, the e-field amplitude has a monotonic descent over a period 1206, 1406, 1506, 1606, 1706, 1806, 1906, 2006, and 2106, respectively, that correspond to over 4500 samples at 130 samples per cycle of power line 104 (e.g., 7800 samples per second). For example, periods 1206, 1406, 1506, 1606, 1706, 1806, 1906, 2006, and 2106, are each approximately half-a-second. A monotonic descent over a shorter period does not indicate presence of line break 120 where protections devices have not been activated. Current graph 2050 of FIG. 20 illustrates example low amperage rain 2056; however, low amperage rain 2056 is not a factor that is explicitly searched for by the software 220, but information is captured to some degree by the fault signatures 224 and may appear in the cross correlations.

Fault Detection

As shown in FIG. 16, software 220 of line sensor 106 implements a cross-correlator 2204 for real-time processing of e-field data 214 and current data 216 as it is sensed by e-field sensor 204 and current sensor 206, against each e-field template 218 and current template 219 of each fault signature 224, respectively. Cross-correlator 2204 may implement a linear cross-correlation algorithm that processes sensed e-field data 214 against e-field template 218 of each fault signature 224 stored in memory 212, and processes sensed current data 216 against current template 219 of each fault signature 224 stored in memory 212. Linear cross correlation takes two input signals and generates a third signal that describes the 'similarity' between each of the two input signals at different overlaps. Linear cross correlation is similar to autocorrelation, however the linear cross correlation describes the similarity between two separate input signals, as opposed to only one.

The software 220 may implement each of e-field data 214 and current data 216 as a cyclic buffer with a sliding window, where the correlation coefficient (e.g., a value between zero and one, where zero indicate no correlation and one indicated exact correlation) is calculated for each window to generate an e-field similarity vector 2206 and a current similarity vector 2208. The e-field similarity vector 2206 and the current similarity vector 2208 are each a list of correlation coefficients. Since the fault signals depicted by FIGS. 14 and 15, and corresponding templates 218/219, share distinct attributes as described above, the cross-correlator 2204 may use the fault signatures 224 to identify similar waveforms in the e-field data 214 and the current data 216 as they occur. The e-field similarity vector 2206 and the current similarity vector 2208 provide a metric of certainty denoting how similar the sensed e-field and current signals are to the fault signature 224. Software 220 may then determine an e-field match similarity 2210 as a maximum value of e-field similarity vector 2206, and a current match similarity 2212 as a maximum value of current similarity vector 2208, and thus e-field match similarity 2210 indicates a best match of e-field data 214 to e-field template 218, and current match similarity 2212 indicates a best match of current data 216 to current template 219.

Memory 212 also stores an e-field threshold 2214 that defines a minimum correlation value required for software 220 to determine that e-field data 214 matches the e-field template 218. Memory 212 also store a current threshold 2216 that defines a minimum correlation value required for software 220 to determine that current data 216 matches the current template 219. The e-field threshold 2214 and the current threshold 2216 may be received and/or updated by server 150, via wireless communication interface 306 and wireless interface 208 for example.

In one example of operation, software 220 uses a portion (e.g., a snippet) of each e-field template 218 or current template 219 of one fault signature 224 as the second signal input to the cross-correlator 2204, and the windowed portion of e-field data 214 or current data 216, respectively, is used as the first signal input to the cross-correlator 2204. Particularly, the portion of each template 218/219 near the conductor break is used for matching, and maybe down-sampled (e.g., by a factor of thirty-two) to reduce computational requirement. Cross-correlator 2204 thereby compares sensed e-field and current signals (e.g., e-field data 214 and current data 216) to each fault signature 224 (e.g., e-field template 218 and current template 219), and generates the corresponding e-field similarity vector 2206 and the current similarity vector 2208 that indicates similarity of the sensed e-field and current signals to the fault signature 224. The e-field match similarity 2210 represents the maximum similarity between the sensed e-field to the e-field template 218, and the current match similarity 2212 represents the maximum similarity between the sensed current signal and the current template 219. In another example of operation, a single template may be used by software 220 to further reduce computational requirement. However, the single optimal template still allows system 100 to successfully detect relevant disturbances on power line 104 while ignoring noise.

Where the e-field match similarity 2210 is above the e-field threshold 2214 and the current match similarity 2212 is above the current threshold 2216, then the software 220 classifies the e-field data 214 and the current data 216 as a potential line break. In one example, where the e-field match similarity 2210 is above 0.97 and the current match similarity 2212 is above 0.96, both values are above the corresponding e-field threshold 2214 and current threshold 2216, then the software 220 may determine that it is a potential line break, although it is not a 100% certainty. The certainty may be a function of proximity. For example, sensed e-field and current signals that result in an e-field match similarity 2210 of 0.97, and a current match similarity 2212 of 0.96, are classified as less likely to be a line break than sensed e-field and current signals that result in an e-field match similarity 2210 of 0.98, and a current match similarity 2212 of 0.98.

In certain embodiments, the software 220 may send the e-field data 214 and the current data 216 (e.g., the windowed portion thereof) to the server 150, via wireless communication interface 306 and wireless interface 208, for further evaluation and/or qualification (e.g., where the server 150 may ensure that the potential line break is not a false positive, such as may occur when an intentional line break is caused by one of circuit breaker 110, switch 112, first recloser 114 and/or second recloser 116). In certain embodiments, server 150 may also approximate the location of the line break 120 based upon reports from multiple line sensors 106 and their corresponding correlation values. For example, the closest downstream line sensor 106 may have the highest correlation value, whereas a line sensor that is further downstream may have a lower correlation value. Location of each sensor 106 is known via the on-board positioning interface 202 or is otherwise stored in memory of the line sensor or server during installation of the line sensor on the power line.

Confidence Determination

To determine the reliability of a line break decision, the software 220 determines a confidence value 2240 between 0 and 1, where a value of 1 indicates a certainty of the line break (e.g., line down or line damaged), and a value of 0 indicates a certainty of there being no line break. The confidence value 2240 may be calculated using one of two ways: (1) Logistic regressive confidence estimate, and (2) Linear approximation of decision boundary.

The logistic regressive confidence estimate is a probability function obtained from fitting the known data to a logistic regression model that has the structure:

$$p(x) = \frac{1}{1 + e^{-(\beta_0 + \beta_1 * xcor_e + \beta_2 * xcor_i)}}$$

However, this approach is difficult to implement with big integer calculations, since it requires an inverse and is hyper-sensitive to dropped floating points. Although it may be more accurate and may be interpreted as a true probability, the marginal benefits do not outweigh the difficulty of implementation.

Figure 17:
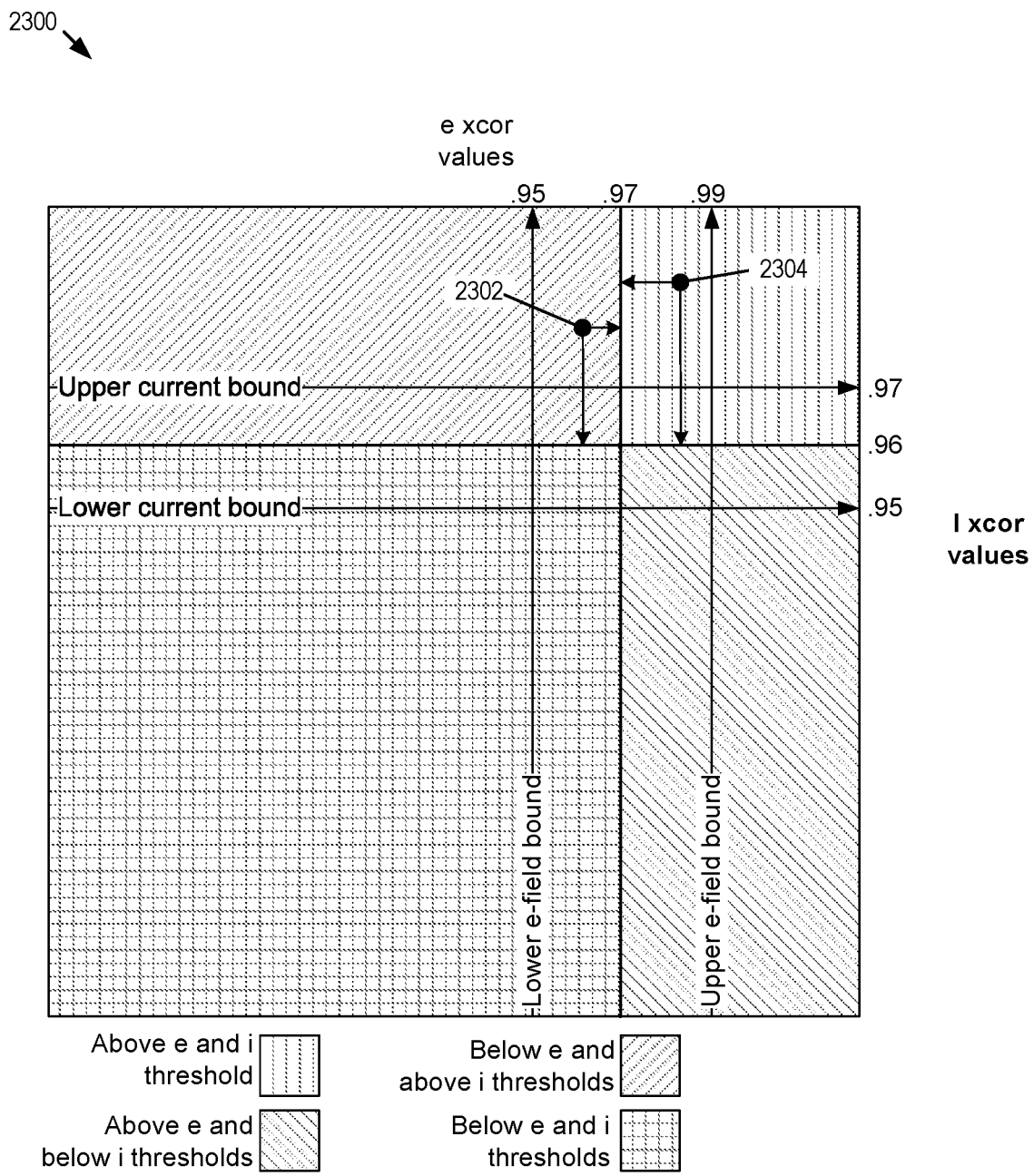
FIG. 17 is a graph illustrating example decisions made by the software of the line sensor of FIG. 2, in embodiments.

The Linear approximation of decision boundary approach is simpler and therefore easier to implement. In this method the match certainty is determined via a piecewise function attached to two linear functions bounded at 0.05 and 0.95. FIG. 17 is a graph 2300 illustrating decisions made by the software 220 of line sensor 106 based, at least in part, on values of e-field match similarity 2210 and current match similarity 2212 resulting from cross-correlation values for e-field (e) and current (i). Notice that point 2302 would not be a line break, whereas point 2304 would be a line break classification. The upper and lower bounds also define the confidence distribution. The piecewise function may be denoted as:

$$p(x) = \begin{cases} xcor_e < LB_e \text{ or } xcor_i < LB_i \\ \min(xcor_e, xcor_i)_{.95}^{.05}(xcor_e > LB_e \text{ and } xcor_i > LB_i) \text{ and} \\ (xcor_e < UB_e \text{ or } xcor_e < UB_e) \\ (xcor_e > UB_e) \text{ and } (xcor_i > UB_i) \end{cases}$$

Figure 18:
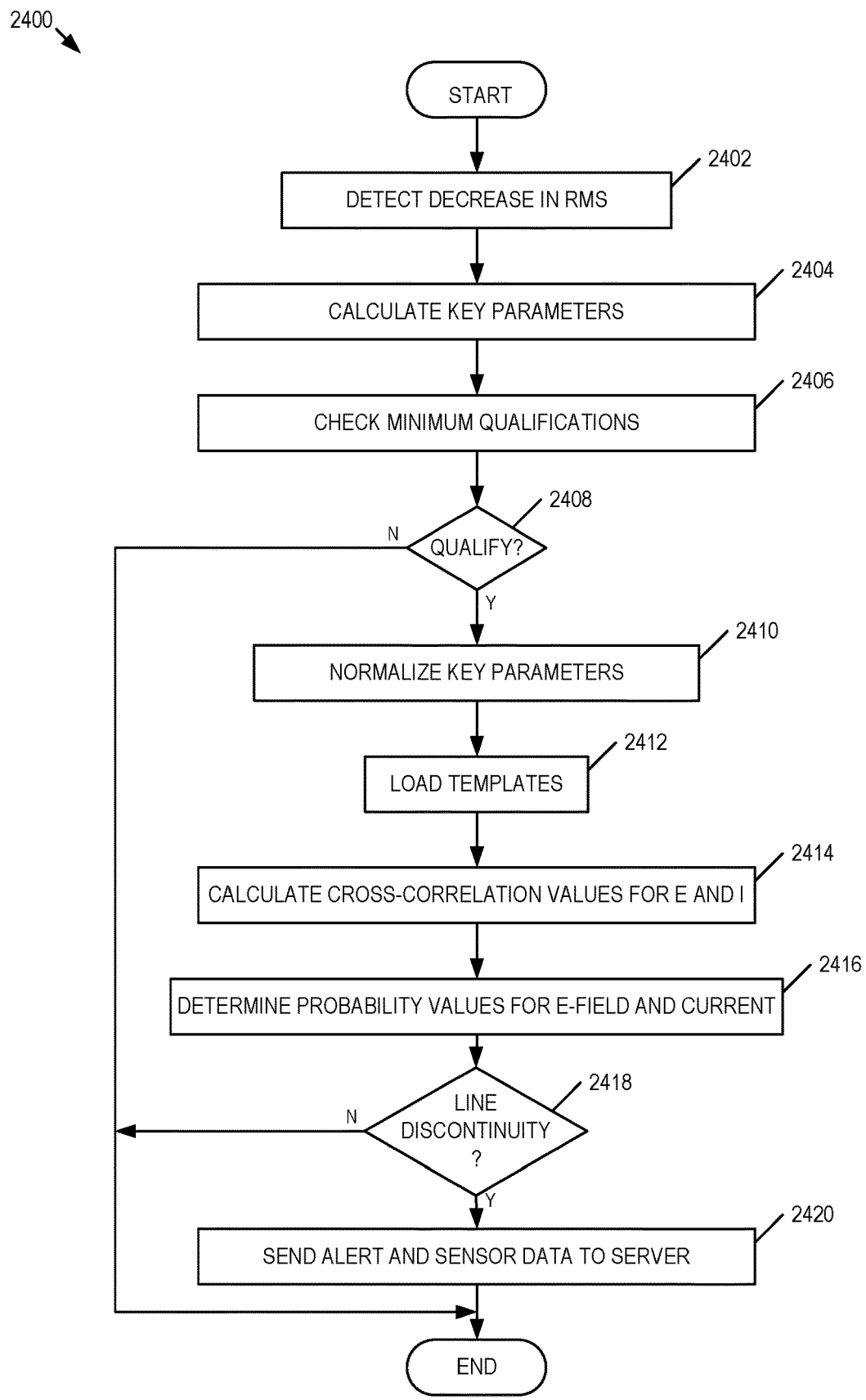
FIG. 18 is a flowchart illustrating one example computer-implemented method for power line sensing with wildfire prevention and detection, in embodiments.

FIG. 18 is a flowchart illustrating one example computer-implemented method 2400 for power line sensing with wildfire prevention and detection. Method 2400 is implemented by software 220 of line sensor 106, for example. The software 220 and the method 2400 are based, at least in part, on the fundamental frequency RMS, which is calculated using a standard analytics method.

In block 2402, method 2400 detects a minimal decrease in RMS. In one example of block 2402, software 220 calculates current RMS values 2226 from the current data 216 and determines when there is a drop of at least 60% in the current RMS values 2226 over a certain period (e.g., minimum of five cycles, but the percentage drop and the period are configurable). This drop in the sensed current is a first indication of the line break 120. Unless this drop occurs, method 2400 may omit subsequent blocks.

In block 2404, method 2400 calculates key parameters of e-field and current data. In one example of block 2404, software 220 calculates a e-field parameter 2220 including e-field RMS value 2224 from the e-field data 214, calculates a current parameter 2222 current data 216 including calculated current RMS value 2226. Software 220 may also calculate an e-field drop 2228 in the e-field RMS value 2224 over a certain period (e.g., every ¼ cycle over a rolling 1 cycle window) and software 220 may calculate a current drop 2230 in the current RMS value 2226 over a certain period (e.g., every ¼ cycle over a rolling 1 cycle window). The key parameters calculated in block 2404 are those needed to perform a cross-correlation to one or more fault signatures (e.g., fault signatures 224).

In block 2406, method 2400 checks minimum qualifications of the signal required to perform the cross-correlation. In one example of block 2406, software 220 determines that the e-field drop 2228 is greater than or equal to a first percentage threshold value (such as but not limited to at least fifty percent), that the current drop 2230 is greater than or equal to a second percentage threshold value (such as but not limited to at least sixty-percent), and that the e-field RMS value 2224 is greater than or equal to a first threshold unit value or more (such as but not limited to at least fifty units (e.g., 50 sentient-energy v/m). The e-field sensor 204 does not measure an absolute value of line voltage. However, it is referred to as measuring sentient-energy v/m and used to determine a percentage change in the e-field. When these qualifications are not met, the cross-correlator 2204 is not invoked to analyze the e-field data 214 and the current data 216, since the e-field and current signals are not characteristic of the line break 120. For example, when the line break 120 occurs, as sensed from downstream, current and e-field are interrupted. If there is no interruption, then there is no line break. In certain embodiments, it would be possible to make the minimum qualifications of block 2406 stricter, and certain fixed minimum values could be applied for current, instead of detecting a percentile drop. However, in these embodiments, the interruption in the e-field is best measured as a percent drop since overbuilt lines have a significant effect on sensed e-field data 214. Further, when the e-field is chronically low, small deviations may be exaggerated during normalization, such that these deviations appear like enormous changes that fool the cross-correlation function implemented by cross-correlator 2204. What is more, when the e-field RMS value 2224 is never above 50 units, then the entirety of the sensed e-field signal may result from overbuilt lines.

Block 2408 is a decision. If, in block 2406, method 2400 determines that the minimum qualification of block 2406 are met, method 2400 continues with block 2410; otherwise, method 2400 terminates.

In block 2410, method 2400 normalizes the key parameters. In one example of block 2410, software 220 generates normalized e-field RMS values 2232 by normalizing the e-field RMS values 2224 between −0.5 and +0.5, and generates normalized current RMS values 2234 by normalizing the current RMS values 2226 between −0.5 and +0.5. This normalization is required because the cross-correlation algorithm implemented by cross-correlator 2204 naturally inflates the output data when both input signals are all positive or all negative.

In block 2412, method 2400 loads templates. In one example of block 2412, e-field template 218 and current template 219 are loaded for each fault signature 224. In block 2414, method 2400 calculates the cross-correlation values for e-field and current. In one example of block 2414, for each fault signature 224, software 220 invokes cross-correlator 2204 to process the normalized e-field RMS values 2232 with e-field template 218 to generate e-field similarity vector 2206, and processes normalized current RMS values 2234 with current template 219 to generate current similarity vector 2208. E-field similarity vector 2206 and current similarity vector 2208 each define correlation coefficients that form the basis of the line break 120 detection decisions.

In block 2416, method 2400 determines confidence values for e-field and current. In one example of block 2416, software 220 determines the e-field match similarity 2210 from e-field similarity vector 2206 and determines the current match similarity 2212 from current similarity vector 2208. Block 2418 is a decision. If, in block 2418, method 2400 determines that the confidence values indicate a line break, method 2400 continues with block 2420; otherwise method 2400 terminates.

In certain embodiments, further data from the line sensors 106 may be used to determine probability of a line fault occurrence. For example, accelerometer data from the line sensors 106 may be received. When the accelerometer data indicates rapid acceleration of the line sensor 106 corresponding to a potential line fault event based on e-field and current data, then the probability level may be adjusted because there is likely a wind-event that caused the line fault. As another example, the accelerometer data may include a rapid acceleration, and then a deceleration when the line hits the ground.

In block 2420, method 2400 sends an alert and sensor data to the server. In one example of block 2420, software 220 generates and sends alert 230 identifying the line sensor 106 indicating the line break 120. In certain embodiments, software 220 also sends at least part of the corresponding e-field data 214 and the corresponding current data 216 to the server for further evaluation.

In certain embodiments, the alert sent in block 2440 (e.g., alert 230) may include a location estimate of the fault. For example, positional data may be received from the line sensor 106 (e.g., as identified via positional interface 202). This positional data may be used to determine the location of the fault. In embodiments, only downstream sensors are able to see the line break. Accordingly, the alert 230 generated based on sensor data from one line sensor (e.g., line sensor at location S3 in FIG. 1) may be compared to alert(s) from other of line sensors. Because upstream sensors from the fault do not indicate a fault, the location may be determined to at least between two sensors (e.g., between sensor 106(2) at location S2, and sensor 106(3) at location S3). Furthermore, if the system has access to PTZ camera/Near-IR network 1004, the alert output may include received images corresponding to and around (e.g., within a given radius of) the identified location).

In embodiments, the alert is output to a SCADA (e.g., SCADA system 1006 in FIG. 10) for control of equipment coupled with the power line in response to the line break. In embodiments, the alert is output to an emergency response platform (e.g., emergency response platform 1002 in FIG. 10) used by an emergency response team.

Advantageously, even when protection devices 110, 112, 114, and 116 have not been activated by other monitoring and/or safety devices, the line sensor 106 recognizes, through the cross-correlation, characteristics of the sensed e-field and current that match the fault signature 224 of the line break 120. Software 220 may cross-correlate the e-field RMS values 2224 and the current RMS values 2226 to a plurality of fault signatures 224, such that the line break 120 may be detected irrespective of variations in circumstances. By sending this early warning of the line break 120, the server 150 may automatically activate one or more protection devices 110, 112, 114, and 116 and prevent a wildfire from starting.

Combination of Features

The following embodiments are specifically contemplated, as well as any combinations of such embodiments that are compatible with one another:

A. A power line sensor with power line fault analytics, includes: a wireless interface; an e-field sensor; a current sensor; a processor communicatively coupled with the wireless interface, the e-field sensor, and the current sensor; and memory communicatively coupled with the processor. The memory stores: at least one fault signature having an e-field template defining e-field attributes that occur in response to a line break, and a current template defining current attributes that occur in response to the line break; and machine-readable instructions that, when executed by the processor, cause the processor to: determine e-field key parameters based on e-field data, representing electrical field produced by a power line to which the line sensor is installed, received from the e-field sensor; determine current key parameters based on current data, representing current through the power line, received from the current sensor; cross-correlate the e-field key parameters and the current key parameters to determine a line break; and send, via the wireless interface, an alert to a server indicating the line break.

B. In the line sensor denoted as A, the e-field key parameters including e-field RMS.

C. In either of the line sensors denoted as A or B, the current key parameters including current RMS.

D. Any of the line sensors denoted as A-C, further including further machine-readable instructions stored in the memory that, when executed by the processor, further cause the processor to: normalize the e-field key parameters values to generate normalized e-field key parameters; cross-correlate the normalized e-field key parameters to the e-field template to determine an e-field match similarity; normalize the current key parameters to generate normalized current key parameters; cross-correlate the normalized current key parameters to the current template to determine a current match similarity; determine the line break when both (a) the e-field match similarity is greater than an e-field threshold, and (b) the current match similarity is greater than a current threshold.

E. Any of the line sensors denoted as A-D, further including further machine-readable instructions stored in the memory that, when executed by the processor, further cause the processor to: receive a signal waveform including the e-filed data and the current data, the e-field key parameters including e-field RMS, the current key parameters including current RMS; determine a first qualification that the e-field RMS values are greater than a first threshold unit value (such as but not limited to 50 units); determine a second qualification that the current RMS values show a drop of a first percentage threshold value or more (such as but not limited to at least 60%); determine a third qualification that the e-field RMS values show a drop of a second percentage threshold value or more (such as but not limited to at least 50%); and disqualify the signal waveform as a potential line break when one or more of the first qualification, the second qualification, and the third qualification are not met.

F. Any of the line sensors denoted as A-E, further including further machine-readable instructions stored in the memory that, when executed by the processor, further cause the processor to send, using the wireless interface, one or both of the e-field key characteristics and the current key characteristics corresponding to the line break to a server.

G. Any of the line sensors denoted as A-F, further including further machine-readable instructions stored in the memory that, when executed by the processor, further cause the processor to, prior to sending the alert: delay for a pre-determined period; and when the line reenergizes within the pre-determined period, forego sending the alert.

H. Any of the line sensors denoted as A-G, further including further machine-readable instructions stored in the memory that, when executed by the processor, further cause the processor to, receive accelerometer data from a motion sensor located at the line sensor;

and indicate, in the alert, increased possibility of line break when rapid acceleration occurs proximate in time to the line break as indicated by the e-field data and the current data.

I. A computer-implemented method for line-fault detection, including: receiving e-field data from an e-field sensor of a line sensor positioned at a power line; calculating e-field RMS values for the e-field data; receiving current data from a current sensor of the line sensor; calculating current RMS values for the current data; determining that characteristics of the e-field RMS values and the current RMS values indicate a line break; and outputting an alert indicating the line break.

J. The method denoted as I, further including: normalizing the e-field RMS values to generate normalized e-field RMS values; cross-correlating the normalized e-field RMS values to an e-field template to determine an e-field match similarity; normalizing the current RMS values to generate normalized current RMS values; cross-correlating the normalized current RMS values to a current template to determine a current match similarity; and determining that the characteristics in the e-field RMS values and the current RMS values indicate the line break when both (a) the e-field match similarity is greater than an e-field threshold, and (b) the current match similarity is greater than a current threshold.

K. Either of the methods denoted as I or J, further including: determining a first qualification that the e-field RMS values are greater than a first threshold unit value (such as but not limited to 50 units); determining a second qualification that the current RMS values show a drop of a first percentage threshold value or more (such as but not limited to at least 60%); determining a third qualification that the e-field RMS values show a drop of a second percentage threshold value or more (such as but not limited to at least 50%); and determining that the characteristics in the e-field RMS values and the current RMS values do not indicate a line break when any one or more of the first qualification, the second qualification and the third qualification are not met.

L. Any of the methods denoted as I-K, further including sending the e-field RMS values corresponding to the line break to a server.

M. Any of the methods denoted as I-L, further including receiving accelerometer data from a motion sensor located at the line sensor; and indicate, in the alert, increased possibility of line break when the rapid acceleration occurs proximate in time to the line break as indicated by the e-field data and the current data.

N. Any of the methods denoted as I-M, further including, prior to outputting the alert: delaying for a pre-determined period; and when the line reenergizes within the pre-determined period, forego outputting the alert.

O. Any of the methods denoted as I-N, further including, prior to outputting the alert: delaying for a pre-determined period; and when the line reenergizes within the pre-determined period, indicating short fault indication.

P. A system for identifying line-fault on a power line, including: a server, wirelessly connected to a line sensor attached to the power line, the server comprising computer readable instructions that, when executed by a processor of the server, cause the server to: receive, from the line sensor, a line break signal, the line break signal being based on captured e-field data and current data, captured by the line sensor, as compared to at least one fault signature template; and output an alert indicating a line break.

Q. In the system denoted as P, the alert being output to a SCADA for control of equipment coupled with the power line in response to the line break.

R. In either of the systems denoted as P or Q, the alert being output to an emergency response platform used by an emergency response team.

S. In any of the systems denoted as P-R, the alert activating one or more protection devices to stop power transfer upstream of a location of the line sensor transmitting the line break signal.

T. Any of the systems denoted as P-S, further comprising further computer readable instructions that, when executed by a processor of the server, further cause the server to: receive a plurality of additional line break signals from a plurality of additional line sensors coupled to the power line; and spatially correlate the line break signal with the additional line break signals to locate a line break with respect to the plurality of additional line sensors and the line sensor.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A line sensor with power line fault analytics, comprising:
   a wireless interface;
   an e-field sensor;
   a current sensor;
   a processor communicatively coupled with the wireless interface, the e-field sensor, and the current sensor; and
   memory communicatively coupled with the processor and storing:
   at least one fault signature having an e-field template defining e-field attributes that occur in response to a line break, and a current template defining current attributes that occur in response to the line break; and
   machine-readable instructions that, when executed by the processor, cause the processor to:
   determine e-field key parameters based at least in part on e-field data, representing electrical field produced by a power line to which the line sensor is installed, received from the e-field sensor;

determine current key parameters based at least in part on current data, representing current through the power line, received from the current sensor;
normalize the e-field key parameters to generate normalized e-field key parameters;
cross-correlate the normalized e-field key parameters to the e-field template to determine an e-field match similarity;
normalize the current key parameters to generate normalized current key parameters;
cross-correlate the normalized current key parameters to the current template to determine a current match similarity;
determine a line break in response to both (a) the e-field match similarity being greater than an e-field threshold, and (b) the current match similarity being greater than a current threshold; and
send, via the wireless interface, an alert to a computing device indicating the line break.

2. The line sensor of claim 1, the e-field key parameters including e-field RMS.

3. The line sensor of claim 1, the current key parameters including current RMS.

4. The line sensor of claim 1, further comprising further machine-readable instructions stored in the memory that, when executed by the processor, further cause the processor to:
receive a signal waveform including the e-field data and the current data, the e-field key parameters including e-field RMS values, the current key parameters including current RMS values;
determine a first qualification that the e-field RMS values are greater than a first threshold unit value;
determine a second qualification that the current RMS values show a drop of a first percentage threshold value or more;
determine a third qualification that the e-field RMS values show a drop of at least a second percentage threshold value or more; and
disqualify the signal waveform as a potential line break in response to determining that one or more of the first qualification, the second qualification, or the third qualification are not met.

5. The line sensor of claim 1, further comprising further machine-readable instructions stored in the memory that, when executed by the processor, further cause the processor to send, using the wireless interface, one or both of the e-field key parameters and the current key parameters corresponding to the line break to the computing device.

6. The line sensor of claim 1, further comprising further machine-readable instructions stored in the memory that, when executed by the processor, further cause the processor to, prior to sending the alert:
delay for a pre-determined period; and
in response to determining that the line reenergizes within the pre-determined period, forgo sending the alert.

7. The line sensor of claim 1, further comprising further machine-readable instructions stored in the memory that, when executed by the processor, further cause the processor to,
receive accelerometer data from a motion sensor located at the line sensor; and
indicate, in the alert, increased possibility of line break in response to determining that rapid acceleration occurs proximate in time to the line break as indicated by the e-field data and the current data.

8. A computer-implemented method for line-fault detection, comprising:
receiving e-field data from an e-field sensor of a line sensor positioned at a power line;
calculating e-field RMS values for the e-field data;
receiving current data from a current sensor of the line sensor;
calculating current RMS values for the current data;
determining that characteristics of the e-field RMS values and the current RMS values indicate a line break;
delaying outputting an alert indicating the line break for a pre-determined period; and
in response to determining that the line reenergizes within the pre-determined period, indicating a short fault indication or forgoing outputting the alert.

9. The method of claim 8, further comprising:
normalizing the e-field RMS values to generate normalized e-field RMS values;
cross-correlating the normalized e-field RMS values to an e-field template to determine an e-field match similarity;
normalizing the current RMS values to generate normalized current RMS values;
cross-correlating the normalized current RMS values to a current template to determine a current match similarity; and
determining that the characteristics in the e-field RMS values and the current RMS values indicate the line break in response to determining that both (a) the e-field match similarity is greater than an e-field threshold, and (b) the current match similarity is greater than a current threshold.

10. The method of claim 8, further comprising:
determining a first qualification that the e-field RMS values are greater than first threshold unit value;
determining a second qualification that the current RMS values show a drop of a first percentage threshold value or more;
determining a third qualification that the e-field RMS values show a drop of a second percentage threshold value or more; and
determining that the characteristics in the e-field RMS values and the current RMS values do not indicate the line break in response to determining that any one or more of the first qualification, the second qualification, or the third qualification are not met.

11. The method of claim 8, further comprising sending the e-field RMS values corresponding to the line break to a computing device.

12. The method of claim 8, further comprising
receiving accelerometer data from a motion sensor located at the line sensor; and
indicate, in the alert, increased possibility of line break in response to determining that rapid acceleration occurs proximate in time to the line break as indicated by the e-field data and the current data.

13. A computer-implemented method for line-fault detection, comprising:
receiving e-field data from an e-field sensor of a line sensor positioned at a power line;
receiving current data, representing current through the power line, from a current sensor of the line sensor;
receiving a signal waveform including the e-field data and the current data, the e-field data indicating including e-field RMS values, the current data indicating current RMS values;

determining a first qualification that the e-field RMS values are greater than a first threshold unit value;

determining a second qualification that the current RMS values show a drop of a first percentage threshold value or more;

determining a third qualification that the e-field RMS values show a drop of at least a second percentage threshold value or more; and disqualifying the signal waveform as a potential line break in response to determining that one or more of the first qualification, the second qualification, or the third qualification are not met.

14. The method of claim 13, further comprising determining that characteristics of subsequent e-field RMS values and subsequent current RMS values indicate a line break.

15. The method of claim 14, further comprising:
delaying outputting an alert indicating the line break for a pre-determined period; and
in response to determining that the line reenergizes within the pre-determined period, indicating a short fault indication.

16. The method of claim 14, further comprising outputting an alert indicating the line break.

17. The method of claim 16, further comprising:
receiving accelerometer data from a motion sensor located at the line sensor; and
indicate, in the alert, increased possibility of line break in response to rapid acceleration occurring proximate in time to the line break.

18. The method of claim 14, further comprising sending the subsequent e-field RMS values corresponding to the line break to a computing device.

19. The method of claim 14, further comprising:
receive a plurality of additional line break signals from a plurality of additional line sensors coupled to the power line; and
spatially correlate the line break with additional line break signals to locate the line break with respect to the plurality of additional line sensors and the line sensor.

20. The method of claim 14, further comprising:
delaying outputting an alert indicating the line break for a pre-determined period; and
in response to determining that the line reenergizes within the pre-determined period, forgoing outputting the alert.

* * * * *